US012442850B2

(12) United States Patent
Coyne et al.

(10) Patent No.: US 12,442,850 B2
(45) Date of Patent: Oct. 14, 2025

(54) SEMICONDUCTOR DEVICE CONFIGURED FOR GATE DIELECTRIC MONITORING

(71) Applicant: Analog Devices International Unlimited Company, County Limerick (IE)

(72) Inventors: Edward John Coyne, Athenry (IE); John P. Meskell, Castleconnell (IE); Colm Patrick Heffernan, Limerick (IE); Mark Forde, Nenagh (IE); Shane Geary, Sixmilebridge (IE)

(73) Assignee: Analog Devices International Unlimited Company, County Limerick (IE)

( * ) Notice: Subject to any disclaimer, the term of this patent is extended or adjusted under 35 U.S.C. 154(b) by 0 days.

(21) Appl. No.: 18/734,307

(22) Filed: Jun. 5, 2024

(65) Prior Publication Data

US 2025/0004034 A1 Jan. 2, 2025

Related U.S. Application Data

(63) Continuation of application No. 16/996,458, filed on Aug. 18, 2020, now Pat. No. 12,032,014.

(Continued)

(51) Int. Cl.
*G01R 31/26* (2020.01)
*H10D 10/60* (2025.01)

(Continued)

(52) U.S. Cl.
CPC ......... *G01R 31/2608* (2013.01); *H10D 10/60* (2025.01); *H10D 30/65* (2025.01); *H10D 62/393* (2025.01); *H10D 84/409* (2025.01)

(58) Field of Classification Search
CPC ............ G01R 31/2621; G01R 31/2856; G01R 31/2642
See application file for complete search history.

(56) References Cited

U.S. PATENT DOCUMENTS 4,385,337 A 5/1983 Asano et al.
4,811,065 A 3/1989 Cogan (Continued)

FOREIGN PATENT DOCUMENTS

| | | | |
|---|---|---|---|
| EP | 2 434 546 | A1 | 3/2012 |
| TW | I562374 | B | 12/2016 |
| TW | I646653 | B | 1/2019 |

OTHER PUBLICATIONS

English Translation of Office Action dated Apr. 23, 2021 in Taiwanese Application No. 109130191.

(Continued)

*Primary Examiner* — Huy Q Phan
*Assistant Examiner* — Temilade S Rhodes-Vivour
(74) *Attorney, Agent, or Firm* — Knobbe, Martens, Olson & Bear, LLP

(57) ABSTRACT

The disclosed technology relates generally to semiconductor devices, and more particularly to semiconductor devices including a metal-oxide-semiconductor (MOS) transistor and are configured for accelerating and monitoring degradation of the gate dielectric of the MOS transistor. In one aspect, a semiconductor device configured with gate dielectric monitoring capability comprises a metal-oxide-semiconductor (MOS) transistor including a source, a drain, a gate, and a backgate region formed in a semiconductor substrate. The semiconductor device additionally comprises a bipolar junction transistor (BJT) including a collector, a base, and an emitter formed in the semiconductor substrate, wherein the backgate region of the MOS transistor serves as the base of the BJT and is independently accessible for activating the (Continued)

BJT. The MOS transistor and the BJT are configured to be concurrently activated by biasing the backgate region independently from the source of the MOS transistor, such that the base of the BJT injects carriers of a first charge type into the backgate region of the MOS transistor, where the first charge type is opposite charge type to channel current carriers.

20 Claims, 11 Drawing Sheets

Related U.S. Application Data

(60) Provisional application No. 62/897,729, filed on Sep. 9, 2019.

(51) Int. Cl.
*H10D 30/65* (2025.01)
*H10D 62/17* (2025.01)
*H10D 84/40* (2025.01)

(56) References Cited

U.S. PATENT DOCUMENTS 5,218,228 A 6/1993 Williams et al.
6,137,140 A 10/2000 Efland et al.
6,242,787 B1 6/2001 Nakayama et al.
6,275,059 B1 * 8/2001 Sah .................... G01R 31/2621 324/762.08
6,365,932 B1 4/2002 Kouno et al.
6,756,274 B2 6/2004 Williams et al.
6,833,586 B2 12/2004 Tsuchiko
6,894,349 B2 5/2005 Beasom
7,009,261 B2 3/2006 Nakashima
7,285,828 B2 10/2007 Salcedo et al.
7,446,375 B2 11/2008 Xu et al.
7,504,692 B2 3/2009 Dudek et al.
7,514,329 B2 4/2009 Pendharkar et al.
7,566,914 B2 7/2009 Salcedo et al.
7,601,991 B2 10/2009 Salcedo et al.
7,687,853 B2 3/2010 Penharkar et al.
7,910,999 B2 3/2011 Lee et al.
7,911,024 B2 3/2011 Ho et al.
7,960,222 B1 6/2011 Kwon
8,044,457 B2 10/2011 Salcedo et al.
8,222,698 B2 7/2012 Salcedo et al.
8,278,710 B2 10/2012 Khemka et al.
8,319,255 B2 11/2012 Vashchenko
8,320,091 B2 11/2012 Salcedo et al.
8,368,116 B2 2/2013 Salcedo et al.
8,378,420 B2 2/2013 Mallikarjunaswamy
8,416,543 B2 4/2013 Salcedo
8,422,187 B2 4/2013 Parthasarathy et al.
8,432,651 B2 4/2013 Salcedo et al.
8,466,489 B2 6/2013 Salcedo et al.
8,553,380 B2 10/2013 Salcedo
8,564,065 B2 10/2013 Donovan et al.
8,592,860 B2 11/2013 Salcedo et al.
8,610,251 B1 12/2013 Salcedo
8,637,899 B2 1/2014 Salcedo
8,665,571 B2 3/2014 Salcedo et al.
8,680,620 B2 3/2014 Salcedo et al.
8,704,303 B2 4/2014 Mallikarjunaswamy
8,723,227 B2 5/2014 Salcedo et al.
8,796,729 B2 8/2014 Clarke et al.
8,860,080 B2 10/2014 Salcedo
8,946,822 B2 2/2015 Salcedo et al.
8,947,841 B2 2/2015 Salcedo et al.
8,958,187 B2 2/2015 Parthasarathy et al.
9,006,781 B2 4/2015 Salcedo et al.
9,088,256 B2 7/2015 Cosgrave et al.
9,123,540 B2 9/2015 Salcedo et al.
9,147,677 B2 9/2015 Salcedo et al.
9,153,666 B1 10/2015 Iravani et al.
9,171,832 B2 10/2015 Salcedo et al.
9,184,098 B2 11/2015 Salcedo et al.
9,209,683 B2 12/2015 Kalnitsky
9,275,991 B2 3/2016 Salcedo et al.
9,293,912 B2 3/2016 Parthasarathy et al.
9,478,608 B2 10/2016 Salcedo et al.
9,525,078 B2 12/2016 Li et al.
9,634,482 B2 4/2017 Parthasarathy et al.
9,666,671 B2 5/2017 Zhang et al.
10,050,115 B2 8/2018 Brown et al.
10,249,708 B2 4/2019 Yoshida et al.
10,269,916 B2 4/2019 Xia et al.
10,290,702 B2 5/2019 Stuber et al.
12,032,014 B2 7/2024 Coyne et al.
2002/0017683 A1 2/2002 Jeon
2002/0081783 A1 6/2002 Lee et al.
2002/0149067 A1 10/2002 Mitros et al.
2003/0071291 A1 * 4/2003 Beasom ............... H10D 30/668 257/E29.085
2004/0251492 A1 12/2004 Lin
2006/0033163 A1 2/2006 Chen
2007/0158681 A1 7/2007 Kim et al.
2008/0164520 A1 7/2008 Darwish
2008/0296697 A1 * 12/2008 Hsu .................. H01L 23/49827 257/532
2010/0052060 A1 * 3/2010 Lai ..................... H10D 84/0135 257/E21.598
2010/0327343 A1 12/2010 Salcedo et al.
2011/0127602 A1 6/2011 Mallikarjunaswamy
2013/0001685 A1 1/2013 Shirakawa et al.
2013/0120026 A1 5/2013 Zanchi
2013/0320945 A1 12/2013 Kalnitsky
2015/0255450 A1 9/2015 Shrivastava et al.
2015/0340448 A1 11/2015 Babcock et al.
2016/0035891 A1 2/2016 Xu et al.
2016/0071962 A1 3/2016 Senapati et al.
2016/0204096 A1 7/2016 Zhao et al.
2016/0261110 A1 9/2016 Ivanov et al.
2016/0285255 A1 9/2016 O'Donnell et al.
2016/0300830 A1 10/2016 Salcedo et al.
2016/0336740 A1 11/2016 Parthasarathy et al.
2016/0336744 A1 11/2016 Parthasarathy et al.
2017/0102358 A1 * 4/2017 Hoffman ............. H10D 64/254
2017/0229536 A1 8/2017 Stuber et al.
2017/0243862 A1 8/2017 Parthasarathy et al.
2017/0256534 A1 9/2017 Parthasarathy et al.
2017/0299649 A1 10/2017 Coyne et al.
2017/0299650 A1 * 10/2017 Coyne ................ G01R 31/2874
2017/0317070 A1 11/2017 Salcedo et al.
2017/0366002 A1 12/2017 Zhao et al.
2018/0026440 A1 1/2018 Zhao et al.
2019/0189737 A1 6/2019 Koshimizu et al.

OTHER PUBLICATIONS

Office Action dated Apr. 23, 2021 in Taiwanese Application No. 109130191.

Office Action dated Dec. 22, 2023 in Chinese Application No. 202010940339.5.

Han et al., "Improving Breakdown Voltage of LDMOS Using a Novel Cost Effective Design", IEEE Transactions on Semiconductor Manufacturing, vol. 26, No. 2, May 2013, pp. 248-252.

Salcedo et al., "Electrostatic Discharge Protection Framework for Mixed-Signal High Voltage CMOS Applications", IEEE International Conference on Solid-State and Integrated-Circuit Technology, 2008, 4 pages.

Salcedo et al., "Analysis of Safe Operating Area of NLDMOS and PLDMOS Transistors Subject to Transient Stresses," in IEEE Transactions on Electron Devices, vol. 57, No. 10, pp. 2655-2663, Oct. 2010, 9 pages.

Theeuwen et al., "Amplify the future—LDMOS Ruggedness Reliability", Original publication: Microwave Journal, technical feature, Apr. 2009, pp. 96-104 (2009), 5 pages.

Office Action dated Jul. 2, 2024 in German Application No. 10 2020 123 481.3, 10 pages.

(56) References Cited

OTHER PUBLICATIONS

Sah, Chih-Tang, "DCIV Diagnosis for Submicron MOS Transistor Design, Process, Reliability and Manufacturing," © 2001 IEEE, 16 pages.

Sah et al., "Profiling Interface Traps in MOS Transistors by the DC Current-Voltage Method," IEEE Electron Device Letters, vol. 17, No. 2, Feb. 1996.

* cited by examiner

122

Effective Product Application Stress

Targeted CCI Accelerated Stress

SEMICONDUCTOR DEVICE CONFIGURED FOR GATE DIELECTRIC MONITORING

INCORPORATION BY REFERENCE

This application is a continuation of U.S. application Ser. No. 16/996,458, filed Aug. 18, 2020, which claims the benefit of priority of U.S. Provisional Application No. 62/897,729, filed Sep. 9, 2019. The entire disclosure of each of the above Applications is hereby incorporated by reference in its entirety herein.

FIELD OF THE DISCLOSURE

The disclosed technology relates generally to semiconductor devices, and more particularly to semiconductor devices including a metal-oxide-semiconductor (MOS) transistor that are configured for accelerating and monitoring degradation of the gate dielectric of the MOS transistor.

BACKGROUND

Description of the Related Art

To improve the reliability of gate dielectrics in metal-oxide-semiconductor (MOS) field effect transistors such as DMOS transistors, certain reliability tests may be performed. For example, transistors having the gate dielectrics may be placed under conditions, e.g., temperature, cycling and/or bias conditions, in which degradation of the gate dielectrics can be accelerated. Information obtained from such reliability tests may be used to troubleshoot the failure signature such that the reliability of the transistors can be improved. For example, by accelerating gate dielectric failures and statistically analyzing the failure behavior, the cause(s) of such failures can be determined. However, because many existing reliability tests may be performed under accelerated stress conditions that may be substantially different from actual use conditions, these reliability tests may not necessarily provide accurate information that can be used to troubleshoot the failures that occur in actual use. Thus, there is a need for a device and a method for accelerating degradation of the gate dielectrics of transistors, e.g., DMOS transistors, under conditions that subject the transistors during actual use of the device and/or under conditions in which the transistors are placed under conditions that are close to their actual use conditions.

SUMMARY OF SOME ASPECTS OF THE DISCLOSURE

In a first aspect, a semiconductor device configured with gate dielectric monitoring capability comprises a metal-oxide-semiconductor (MOS) transistor including a source, a drain, a gate, and a backgate region formed in a semiconductor substrate. The semiconductor device additionally comprises a bipolar junction transistor (BJT) including a collector, a base, and an emitter formed in the semiconductor substrate, wherein the backgate region of the MOS transistor serves as the base of the BJT and is independently accessible for activating the BJT. The MOS transistor and the BJT are configured to be concurrently activated by biasing the backgate region independently from the source of the MOS transistor, such that the base of the BJT injects carriers of a first charge type into the backgate region of the MOS transistor, the first charge type being opposite charge type to channel current carriers.

In a second aspect, a semiconductor device comprises a double diffused metal-oxide-semiconductor (DMOS) transistor and a bipolar junction transistor (BJT) formed in a semiconductor substrate, wherein a well of a first type serving both as a backgate region of the DMOS transistor and as a base of the BJT is configured to be biased independently through a separate well contact, wherein the DMOS transistor and the BJT are configured to be concurrently activated by biasing the backgate region independently from a source of the DMOS transistor.

In a third aspect, a method of monitoring a gate dielectric of a metal-oxide-semiconductor (MOS) transistor comprises providing a semiconductor device comprising a metal-oxide-semiconductor (MOS) transistor and a bipolar junction transistor (BJT), wherein a backgate region of the MOS transistor serving as a base of the BJT is independently accessible for activating the BJT. The method additionally comprises concurrently activating the MOS transistor and the BJT by biasing the backgate region independently from the source of the MOS transistor, such that the base of the BJT injects carriers of a first charge type into the backgate region of the MOS transistor, the first charge type being opposite charge type to channel current carriers.

BRIEF DESCRIPTION OF THE DRAWINGS

These and other features, aspects and advantages of the present invention will now be described with reference to the drawings of several embodiments, which embodiments are intended to illustrate and not to limit the invention.

DETAILED DESCRIPTION

Figure 1A:
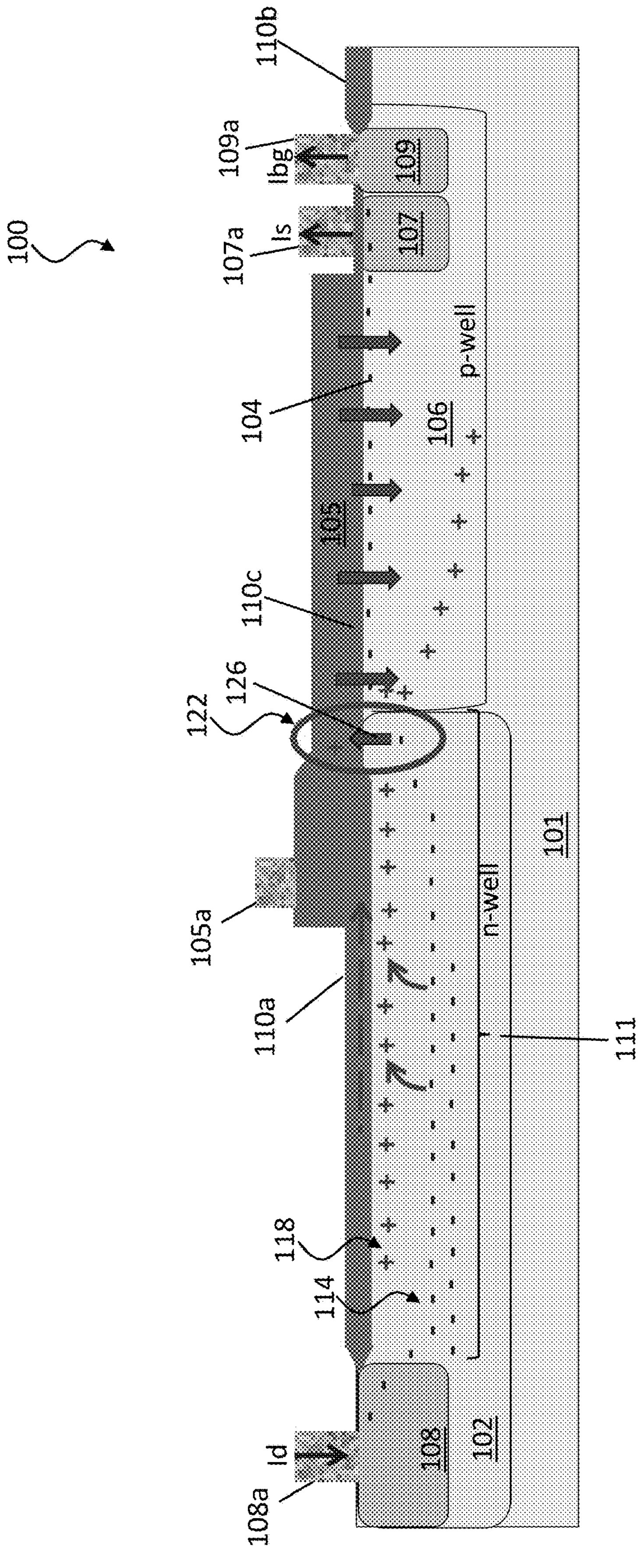
FIG. 1A is a cross sectional view of a semiconductor device configured with gate dielectric monitoring capability, according to embodiments.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures may be of this type but may nevertheless be illustrated as abrupt structures merely for assistance to the reader. In the embodiments described below, p-type regions in silicon can include a p-type semiconductor material, such as boron, as a dopant. Further, n-type regions in silicon can include an n-type semiconductor material, such as phosphorous, as a dopant. A skilled artisan will appreciate various concentrations of dopants in regions described below.

Power devices such as radio frequency (RF) power devices are used in many applications, e.g., wireless technologies. For some applications, power devices are based on metal-oxide-semiconductor (MOS) device technology, e.g., double diffused metal-oxide-semiconductor transistor (DMOS) technology. The DMOS technology can be used in amplifiers, including microwave power amplifiers, RF power amplifiers and audio power amplifiers.

In recent years, lateral DMOS (LDMOS) have become the popular devices for monolithic high-voltage and smart power applications. Silicon-based RF lateral DMOS (RF LDMOS) can be widely found in mobile networks, and enables much of the world's cellular voice and data traffic. The advantages of LDMOS include a reduction in the number of fabrication steps, multiple output capability on the same chip and compatibility with advanced VLSI technologies. LDMOS devices are widely used in RF power amplifiers for base-stations for their high output power and a correspondingly high (e.g., >60 V) drain-to-source breakdown voltage. A DMOS such as a LDMOS can include an extended drain drift region which can be lightly doped to gradually drop a relatively large magnitude of voltage between a gate and a drain of the DMOS. This allows DMOS technology to be useful for high voltage devices such as power devices. However, certain reliability degradation can arise in DMOS technologies in connection with the extended drain drift region.

In particular, various reliability degradations in MOS technologies can be associated with degradation of the gate dielectric. Reliability degradations of the gate dielectric can cause various failures, including threshold voltage shifts, gate leakage, and breakdown between the gate and the source, drain or channel. Such failures can in turn be caused by injection and/or trapping of carriers in the gate dielectric. The inventors have discovered that one type of reliability failure is associated with the effect of a drain bias on the degradation of the gate dielectric of some MOS devices. For example, in the case of an n-channel DMOS (nDMOS) transistor, the electrons forming the channel under certain bias conditions can leads to generation of holes, e.g., in an extended drain drift region. Thus generated holes may build up or be injected into certain portions of the gate dielectric, e.g., over the drain draft region, which may in turn lead to the degradation and/or failure of the dielectric. For example, without being bound to any theory, the holes may tunnel into available states in the gate dielectric and at least temporarily be trapped therein. Over a period of time, the trapped holes may weaken the gate dielectric and eventually cause the device to fail. For example, the trapped holes can increase the local electric field in the gate dielectric, and lead to dielectric breakdown.

Because of the detrimental effects holes on gate dielectrics, understanding correlations between failures and physical parameters, such as process parameters, can be extremely valuable in enhancing reliability and yield. Information obtained from such correlations may be used to troubleshoot the cause of the failure. For example, by accelerating gate dielectric failures at the and statistically analyzing the failure behavior at the die-level, wafer-level or a lot-level, the cause(s) of such failures may be traced to physical monitor parameters collected at different fabrication process steps. Based on such information, the failure-causing process parameter may be adjusted to improve the reliability and yield. Thus, there is a need for a stress acceleration scheme that can reproduce failures in a predictable manner.

However, reproduction of gate dielectric failures in a laboratory time scale can be difficult, as the gate dielectric failure can occur at a later part of the operational life of the semiconductor device. For example, the inventors have discovered that simply subjecting a DMOS to higher operational voltages in an attempt to accelerate hole injection into the gate dielectric has not proven to be effective in reproducing the gate dielectric failure that actually occurs in products, or successfully correlating the failure to process parameters. To illustrate this reliability failure mode and the technical solutions discovered by the inventors according to embodiments, an MOS device according to embodiments is illustrated in FIG. 1A.

FIG. 1A illustrates, by way of example, a cross-sectional view of a semiconductor device 100, e.g., a power semiconductor device, comprising a lateral DMOS (LDMOS) transistor. While the illustrated semiconductor device 100 includes a LDMOS transistor, it will be understood that various embodiments described herein are not limited to devices that include DMOS or LDMOS devices, but rather they can be implemented in any devices that include a MOS device in which a drain bias can lead to a gate dielectric degradation or failure due to injection of majority carriers (e.g., holes in an NMOS device). The semiconductor device 100 comprises various regions formed in a semiconductor substrate 101. As described herein and throughout the specification, it will be appreciated that the semiconductor substrate 101 can be implemented in a variety of ways, including, but not limited to, a doped semiconductor substrate or a silicon on insulator (SOI) substrate including a silicon-insulator-silicon structure in which various structures such as regions of a transistor are isolated from a support substrate using an insulator layer such as a buried $SiO_2$ (BOX) layer. In addition, it will be appreciated that the various structures described herein can be at least partially formed in an epitaxial layer formed at or near a surface region. When the substrate 101 is an SOI substrate, the illustrated portion of the substrate 101 can be the portion above the BOX layer (not shown for clarity).

Still referring to FIG. 1A, in the following, without limitation, the semiconductor device 100 including a DMOS transistor implemented as an n-channel LDMOS (nLDMOS) transistor will be described. When the LDMOS transistor is an nLDMOS transistor, the semiconductor substrate 101 may be a p-doped semiconductor substrate. The semiconductor device 100 further comprises an n-doped well or region (n-well) 102 formed in the substrate 101. The n-well 102 may be formed of an epitaxially grown n-doped layer. A portion of the n-well 102 forms a lightly n-doped (n) extended drain drift region 111 of the nLDMOS transistor in which the electrical conductivity is primarily attributable to electrons. While not shown for clarity, the n-well 102 may be a multilayer region comprising a buried n-doped region in the p-doped substrate 101 and an n-doped region over the buried n-doped region.

The illustrated LDMOS transistor further comprises a gate 105, a backgate region 106, a source 107 and a drain 108. The source 107 and the drain 108 are laterally interposed by the gate 105. The drain 108 is formed within the n-well 102, e.g., fully enclosed therewithin. The backgate region 106 is laterally adjacent to the source 107 on one side and laterally adjacent to the n-well 102 on the other side. The source 107 and drain 108 have higher overall n-type dopant concentrations than the n-well 102. The source 107 and the drain 108 may include, e.g., a heavily n-doped ($n^+$) regions. A backgate contact region 109 is formed within the backgate region 106. The backgate contact region 109 has a higher overall p-type dopant concentrations than the backgate region 106. The backgate contact region 109 may be, e.g., a heavily p-doped ($p^+$) region.

Still referring to FIG. 1A, the semiconductor device 100 additionally comprises one or more isolation regions including an isolation region 110*a* formed over the n-well 102 and at least one additional isolation region 110*b* formed over the semiconductor substrate 101. The electrical contact to the source 107 and the electrical contact to the drain 108 are made using conductive contact vias 107*a*, 108*a* respectively. The electrical contact to the backgate contact region 109 is made using a backgate contact via 109*a*. The isolation regions 110*a*, 110*b* may be formed of an oxide, e.g., a field oxide comprising $SiO_2$, which may be formed by local oxidation (LOCOS). However, embodiments are not so limited and the isolation regions can be formed of any suitable structure, including a shallow trench isolation (STI).

In some embodiments, the backgate region 106 may have a higher overall p-type dopant concentration than the substrate 101. For example, the backgate region 106 may be formed in a p-doped well or region (p-well), and may be defined as the p-doped region between the source 107 and the n-well 102. The p-doped well and the source 107 are formed by sequentially diffusing p-type and n-type dopants through a common substrate opening formed between the gate 105 and the isolation region 110*b* (hence the terms "double diffused" in DMOS). Thus, the p-well may also be formed of an epitaxial layer. The backgate contact region 109 may also be formed after forming the p-doped well by further diffusing a p-type dopant. In the illustrated embodiment, the source 107 and the backgate contact region 109 are fully enclosed within the p-well. A channel region 104 is disposed within the p-well between the source 107 and the n-well 102. The effective channel length is defined by the difference in the lateral diffusions of the p-well and the source 107. A gate dielectric 110*c* is formed over the channel region 104 between the gate 105 and the substrate 101. The gate dielectric 110*c* may be formed, e.g., by thermal oxidation, and can comprise $SiO_2$. It will be appreciated that the gate dielectric 110*c* includes a portion over the p-well and a portion over the n-well 102. The portion of the gate dielectric 110*c* over the n-well 102 abuts the isolation region 110*c*.

As described herein, various $p^+$ regions and $n^+$ regions disclosed herein can have a peak doping concentration exceeding about $1\times10^{19}$ $cm^{-3}$, exceeding about $1\times10^{20}$ $cm^{-3}$, or in the range between about $1\times10^{20}$ $cm^{-3}$ and about $8\times10^{20}$ $cm^{-3}$, for example, about $2\times10^{20}$ $cm^{-3}$. Various wells such as p-wells and n-wells can have a peak doping concentration in the range of about $1.5\times10^{16}$ $cm^{-3}$ to about $7.5\times10^{16}$ $cm^{-3}$, for example, about $5.0\times10^{16}$ $cm^{-3}$. Lightly doped regions such as the n extended drain drift region can have a peak doping concentration of about $1.0\times10^{15}$ $cm^{-3}$ to about $1\times10^{16}$ $cm^{-3}$.

In some embodiments, the gate 105 can be formed of a doped polysilicon layer, e.g., a heavily n-doped ($n^+$) or p-doped ($p^+$) polysilicon layer. The gate 105 extends over a portion of the n-well 102 and the channel region 104. The gate 105 is vertically separated from the n-well 102 and the p-well by the isolation region 110*a* and the gate dielectric 110*c*.

The isolation region 110*a* extends between the drain 108 and the gate dielectric 110*c*. When formed by LOCOS, the resulting $SiO_2$ vertically extends into the n-well 102 and protrudes above the surface level of the gate dielectric 110*c* due to volumetric expansion of silicon when it is oxidized in a LOCOS process. The gate dielectric 110*c* extends laterally over the p-well, between the end of the isolation region 110*a* on one side and the source 107 on the other. The gate dielectric 110*c* is substantially thinner in comparison to the isolation region 110*a*. For example, the thickness of the gate dielectric 110*c* may be at least two orders of magnitude less than the thickness of the isolation region 110*a*. For example, the gate oxide region could have a thickness exceeding e.g., 10 nm, depending on the application, whereas the isolation region 110*a* could have a thickness exceeding, e.g., 200 nm.

In some LDMOS transistors, the source may be electrically shorted with the backgate and held at the same potential to avoid the activation of a parasitic NPN bipolar junction transistor. It will be appreciated that the embodiments disclosed herein are distinguishable from this configuration, and the backgate region r106 and the source 107 are independently connected, e.g., through the backgate contact via 109*a* and the source contact via 107*a* that are not electrically shorted.

Still referring to FIG. 1A, in operation, for the illustrated semiconductor device 100 including the nLDMOS, applying a positive voltage at the gate 105 relative to the backgate region 106 can form a conductive inversion layer comprising electrons in the channel region 104 between the source 107 and the extended drain drift region 111. In conjunction with the voltage on the gate 105, applying a positive voltage on the drain 108 relative to the source 107 allows for the movement of electrons from the source 107 to the drain 108 through the channel region 104. Biasing the gate 105 relative to the drain 108 of the LDMOS transistor results in the formation of a depletion region in the channel region 104 and in the lightly doped (n−) extended drain drift region 111, which drops a bulk of the internal electric field to enable high voltage operation of the LDMOS transistor.

The inventors have discovered that, under some circumstances, electrons 114 that drift in the extended drain drift region 111 can generate minority carriers (holes) 118 therein by a process referred to herein as weak impact ionization, which is described herein without being bound to any theory. Weak impact ionization occurs when the energy gained by the electrons in the extended drain drift region 111 exceed the band gap energy of silicon to create electron-hole pairs. Under normal operations of the nLDMOS transistor, the electrons have a distribution of energies defined by Fermion statistics. While a median energy of the electrons may not be sufficient to create an electron-hole pair, because the electrons have a statistical spread in energy, by probability, some electrons can have sufficient energy to create electron-hole pairs below a critical electric field for breakdown of the semiconductor material caused by a chain reaction. Thus created electron-hole pairs are distinguishable from electron-hole pairs that are generated at or above the critical electric field for breakdown of the semiconductor breakdown. Under breakdown conditions, electrons are accelerated by a relatively strong field, which sets off a chain reaction in which the electrons generate electron-hole pairs that in turn generate additional electron-hole pairs. The chain reaction leading to breakdown by impact ionization.

In the semiconductor device 100 under normal operation, thus created electron-hole pairs are under a sub-critical electric field, and don't attain sufficient energy to sustain a chain reaction. The process is therefore referred to as weak impact ionization. The mechanism generates holes that are then transferred to the backgate region 106 as shown in FIG. 1A by positive signs, and a backgate current is generated when the LDMOS is in the on state. These holes, which are minority carriers in the extended drain drift region 111, can experience numerous scattering events as they drift across the extended drain drift region 111 and readily reach thermal equilibrium with the surrounding crystalline lattice. That is, without being bound to any theory, an effective average temperature of the holes 118 in equilibrium with the lattice may be about the lattice temperature (e.g., 26 meV at room temperature). Some of the generated holes 118 reaching a high field region 122 formed at a dielectric junction or transition region between the isolation region 110*a* and the gate dielectric 110*c* may be injected into the gate dielectric 110*c* within the extended drain draft region 111. A close-up view of the high field region 122 is shown in FIG. 1B.

Figure 1B:
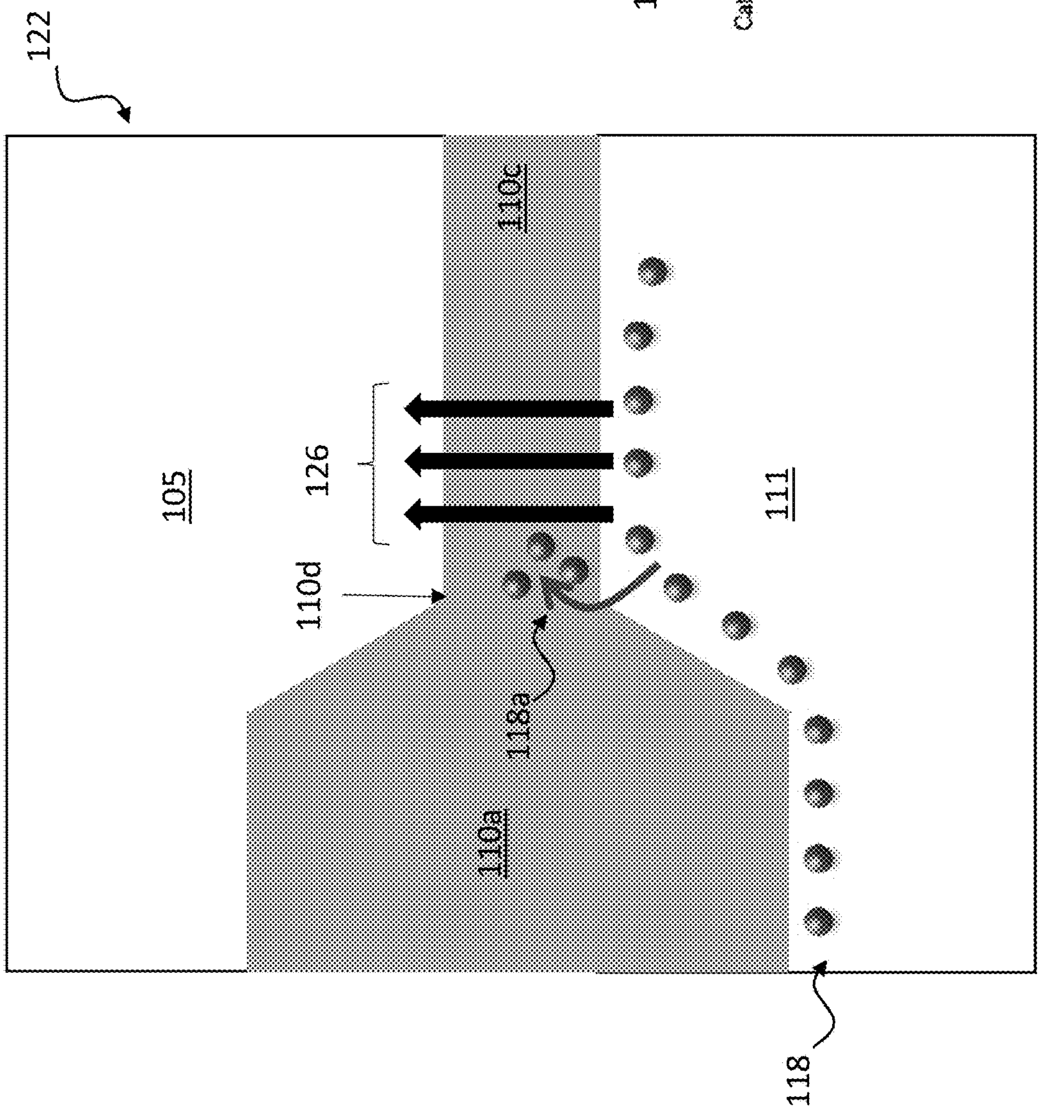
FIG. 1B illustrates a close-up view of a high field region of the semiconductor device shown in FIG. 1A including a portion of the gate dielectric that is subjected to hole injection.

FIG. 1B illustrates a close-up view of the high field region 122 of the semiconductor device 100 described above with respect to FIG. 1A, which includes a dielectric junction 110*d* between the gate dielectric 110*c* and the isolation region 110*a*. The illustrated portion includes the portion of the gate dielectric 110*c* over the extended drain drift region 111 that is subjected to hole injection. Referring to FIG. 1B, it will be appreciated that, in the high-field region 122, the holes 118 are still within the extended drain drift region 111. As a result, as indicated by the direction of the arrows representing the electric field 126 within the high-field region 122, the electric field points in an upward direction from the extended drain drift region 111 towards the gate 105. That is, the electric field 126 has a tendency to inject the positively charged holes into the gate dielectric 110*c*. Furthermore, because of a relatively abrupt reduction in dielectric thickness from the isolation region 110*a* to the gate dielectric 110*c*, there exists a correspondingly abrupt increase in the electric field 126. This electric field 126 pulls the holes 118 from the extended drain drift region 111 towards the gate dielectric 110*c*. The holes 118 can tunnel at least partly through the gate dielectric 110*c* and become at least temporarily trapped holes 118*a*. Thereafter, the trapped holes 118 can further tunnel through the remaining thickness of the gate dielectric 110*c* to be injected into the gate 105, thereby generating gate (leakage) current. Because the injected holes have an energy that is below the critical field for breakdown as described above, this process may be referred to herein as cold carrier injection (CCI). The inventors have determined that the trapped holes can increase the peak electric field across the gate dielectric 110*c* to exceed several MV/cm.

Figure 1C:
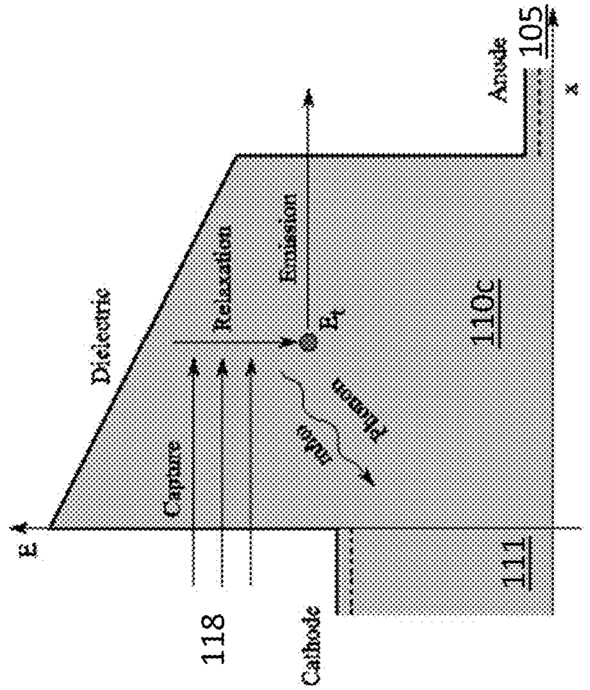
FIG. 1C illustrates a schematic energy band diagram depicting hole injection into the gate dielectric in the high field region illustrated in FIG. 1B.

FIG. 1C illustrates a schematic energy band diagram depicting hole injection into the gate dielectric 110*c* in the high field region 122 shown in FIG. 1B. The holes 118 that tunnel partly through the gate dielectric 110*c* can be trapped by traps at an energy level Et that are at or below the energy level of the tunneling holes 118. The inventors have discovered that, when the gate dielectric 110*c* traps sufficient number or holes and/or is damaged by the tunneling holes under CCI, the electric field built-up or the damage caused in the gate dielectric 110*c* can eventually lead to what is referred to herein as a gate dielectric rupture. As described herein, a gate dielectric rupture refers to a condition in which a permanent leakage path is formed through the gate dielectric 110*c*, which is essentially an Ohmic short. The inventors have found that the rupture of the gate dielectric 110*c* in this manner may be dependent on the density of the holes generated as mentioned above, which is in turn results in a proportional amount of holes injected into the gate dielectric 110*c* and/or trapped therein, and on the strength of the electric field across the gate dielectric 110*c*.

It will be appreciated that the degradation of the gate dielectric by hole tunneling under the CCI process is notably different from a previously known process known as hot carrier injection (HCI), which involves injection of energetic "hot" channel carriers, which are electrons for an nMOS transistor. Unlike HCI, the hole injection under the CCI process involves carriers of the opposite charge type to channel current carriers, or holes in n-channel devices.

Figure 1D:
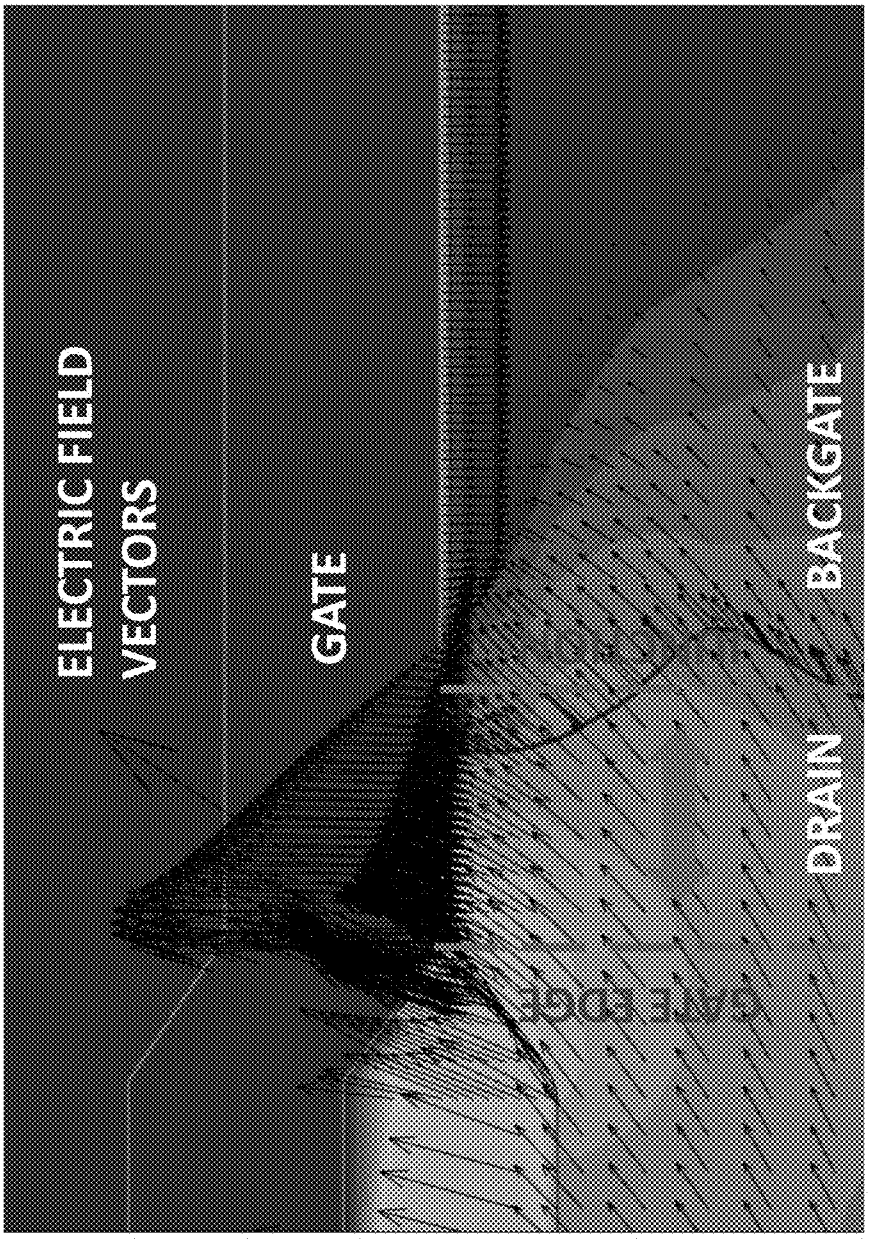
FIG. 1D illustrates a simulated of spatial distribution of electric field in the high field region illustrated in FIG. 1B.

FIG. 1D illustrates a simulated spatial distribution of electric field in the high field region 122 shown in FIG. 1B. The lengths of the arrows indicate the relative strengths and the direction of the arrows indicate the directions of the electric field at various locations within the high field region 122. The largest vector represents a net magnitude and direction of the electric field. As described above with respect to FIG. 1B, because the gate dielectric 110*c* that is subject to CCI is formed over the extended drain drift region 111, as indicated by the direction of the arrows representing the electric field 126, the electric field generally points in an upward direction from the extended drain drift region 111 towards the gate 105. Furthermore, because of the relatively steep reduction in thickness of the dielectric from the isolation region 110*a* to the gate dielectric 110*c*, a correspondingly steep increase in the electric field 126 is observed over the extended drain drift region 111. At or near the semiconductor junction between the extended drain drift region 111 and the backgate region 106, the direction of the electric field reverses, as indicated by block arrows in FIG. 1A. The holes subjected to the upward electric field in the high field region 122 may be injected into gate dielectric 110*c*, thereby causing at least some of the holes to be trapped in the gate dielectric 110*c*. It will be appreciated that these trapped holes may be outside the channel region 104 (FIG. 1A), and may not be measurable as an electrical signature of the transistor as defined by the channel, e.g., the threshold voltage. Nevertheless, the trapped holes 118*a* (FIG. 1B) in the gate dielectric 110*c* can cause degradation of the gate dielectric 110*c*, such as gate dielectric rupture as described above.

Figure 1E:
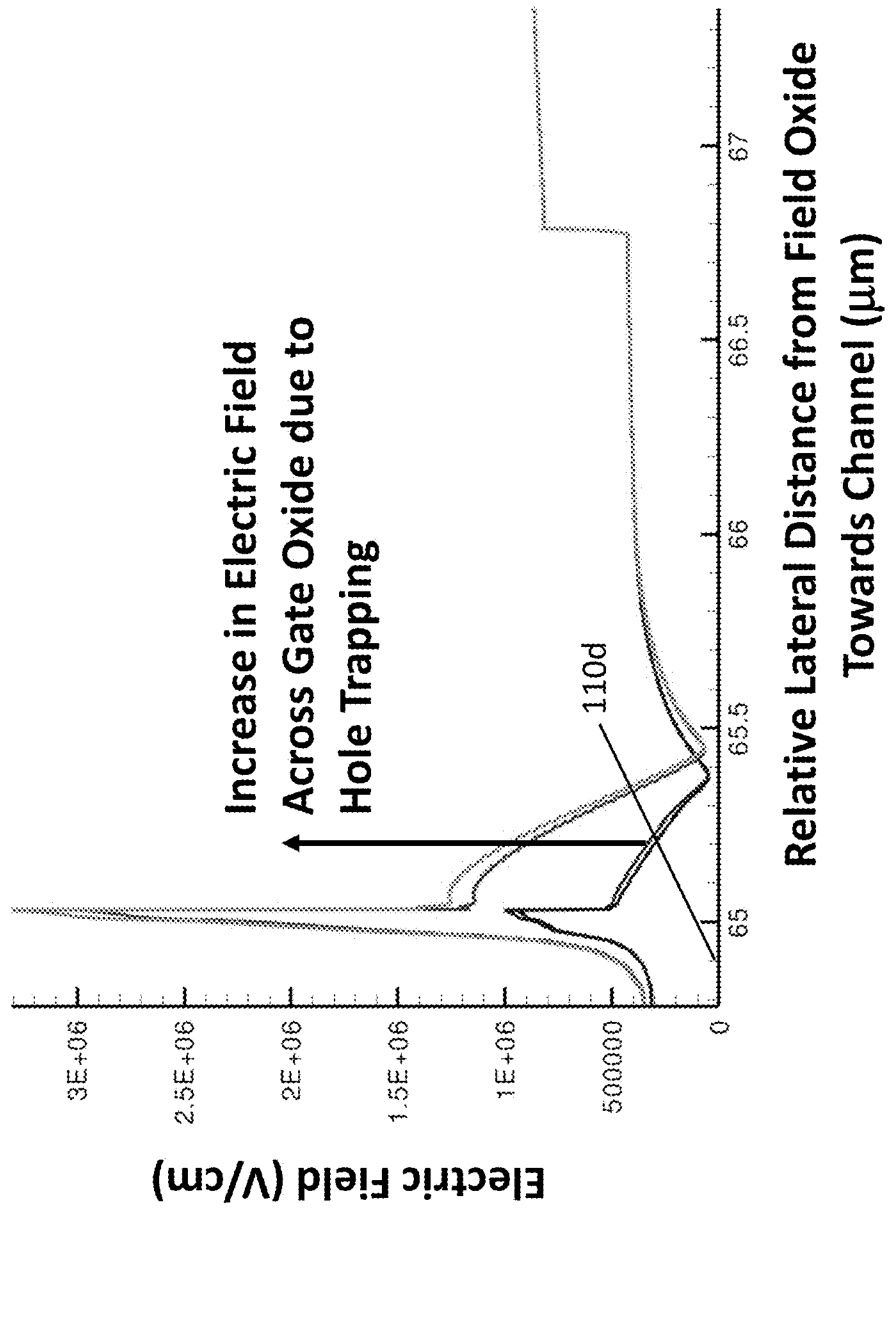
FIG. 1E illustrates simulated of spatial distributions of electric field intensity in the high field region illustrated in FIG. 1B.

FIG. 1E illustrates simulated spatial distributions of the electric field intensity in the high field region 122 illustrated in FIG. 1B for different amounts of trapped holes. The arrow indicates the direction of increasing amount of trapped holes. As shown, the peak of the electric field intensity can increase by several times, near the dielectric junction 110*d* as described above with respect to FIG. 1B. It will be appreciated that the above-described reliability degradation of the gate dielectric arises from the device structure as depicted in FIGS. 1A and 1B, namely that the nLDMOS transistor comprises the extended drain drift region 111 that laterally extends beyond the dielectric junction 110*d* towards the backgate region 106, such that a portion of the gate dielectric 110*c* laterally extends partly into the n-doped extended drain draft region 111, such that the high field region 122 is subjected to a bias that tends to inject the hoes into the gate dielectric 110.

Typically, the degradation of the gate dielectric of MOS transistors occurs gradually by usage and therefore it may not be practical to diagnose such degradation in laboratory time scale without some method of accelerating the process. At least in part to address the above described need to accelerate gate dielectric degradation within a laboratory time frame, the inventors have discovered that by applying an independent voltage to the backgate region 106 of the semiconductor device 100. In particular, by configuring the backgate region 106 to serve as a base of a bipolar junction transistor (BJT), a high concentration of holes relative to normal operating conditions can be generated, thereby accelerating the degradation of the gate dielectric by CCI. In addition, the gate dielectric failure by CCI can be accelerated while subjecting the relevant regions of the MOS transistor to electric fields that are representative of the electric fields under actual product usage.

To apply these advantageous concepts to address the above-described and other reliability concerns associated with MOS devices including LDMOS in which a drain bias induces a degradation of the gate dielectric by hole injection, the inventors have configured the semiconductor device 100 as described above to accelerate stress on the gate dielectric of the LDMOS transistor and to monitor their degradation. As configured, the semiconductor device 100 comprises a bipolar junction transistor (BJT), wherein the backgate region 106 of the LDMOS transistor serves as the base of the BJT and is independently accessible for activating the BJT to customize generation of excess holes, such that the above-described stress on the gate dielectric 110*c* can be accelerated for transistor-level, die-level and/or wafer-level monitoring of the gate dielectric 110*a*. The implementations described herein can enable, among other things, statistical quantification of gate dielectric failures to improve yield and reliability.

It will be appreciated that in existing applications of LDMOS transistors, the source 107 and the backgate region 106 maybe shorted above the substrate, e.g., at the metallization level, to prevent the activation of a parasitic NPN bipolar junction transistor. Unlike such configuration, by having an independently accessible backgate region 106, the amount of excess holes for accelerating the failure of the gate dielectric can be tailored, depending on the application. Furthermore, according to the device configurations and methods described herein, the monitoring can be performed under an accelerated stress mode under which the LDMOS is operated such that relevant device regions are under electric field conditions that are representative of the mode in which the device is used in an actual product. Because of this advantageous configuration, the LDMOS can be operated under the accelerated stress mode under which the gate dielectric degradation is accelerated while the device parameters are similar to those in an actual product, e.g., a power semiconductor device.

As described herein, a product mode refers to a bias mode in which various terminals of the semiconductor device including the source, drain, gate and backgate are subjected to voltages as used in an actual product. In a product mode, the bipolar junction for providing excess carriers to accelerate the stress on the gate dielectric is not activated.

On the other hand, an accelerated stress mode refers to a bias mode in which various terminals of the semiconductor device are subjected to voltages that are different from the product mode to accelerate degradation of the gate dielectric. In an accelerated stress mode, the bipolar junction for providing excess carriers to accelerate the stress on the gate dielectric is activated. The electric field in the gate dielectric region that is subjected to the stress in the accelerated stress mode is about the same as that in the product mode.

Figure 2A:
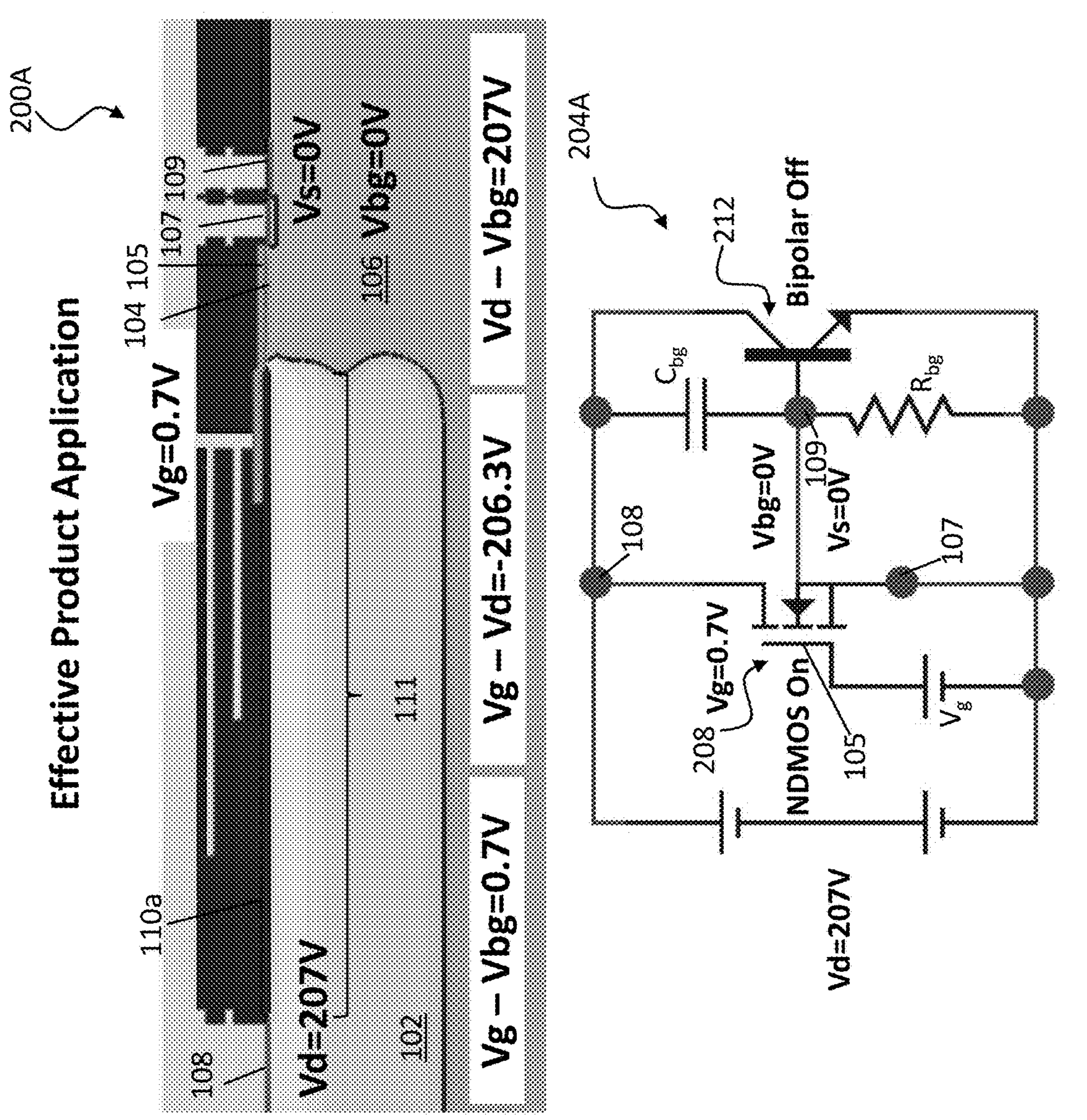
FIG. 2A illustrate a cross-sectional view and circuit diagram of a semiconductor device with an example biasing scheme under a product mode, according to embodiments.
Figure 2B:
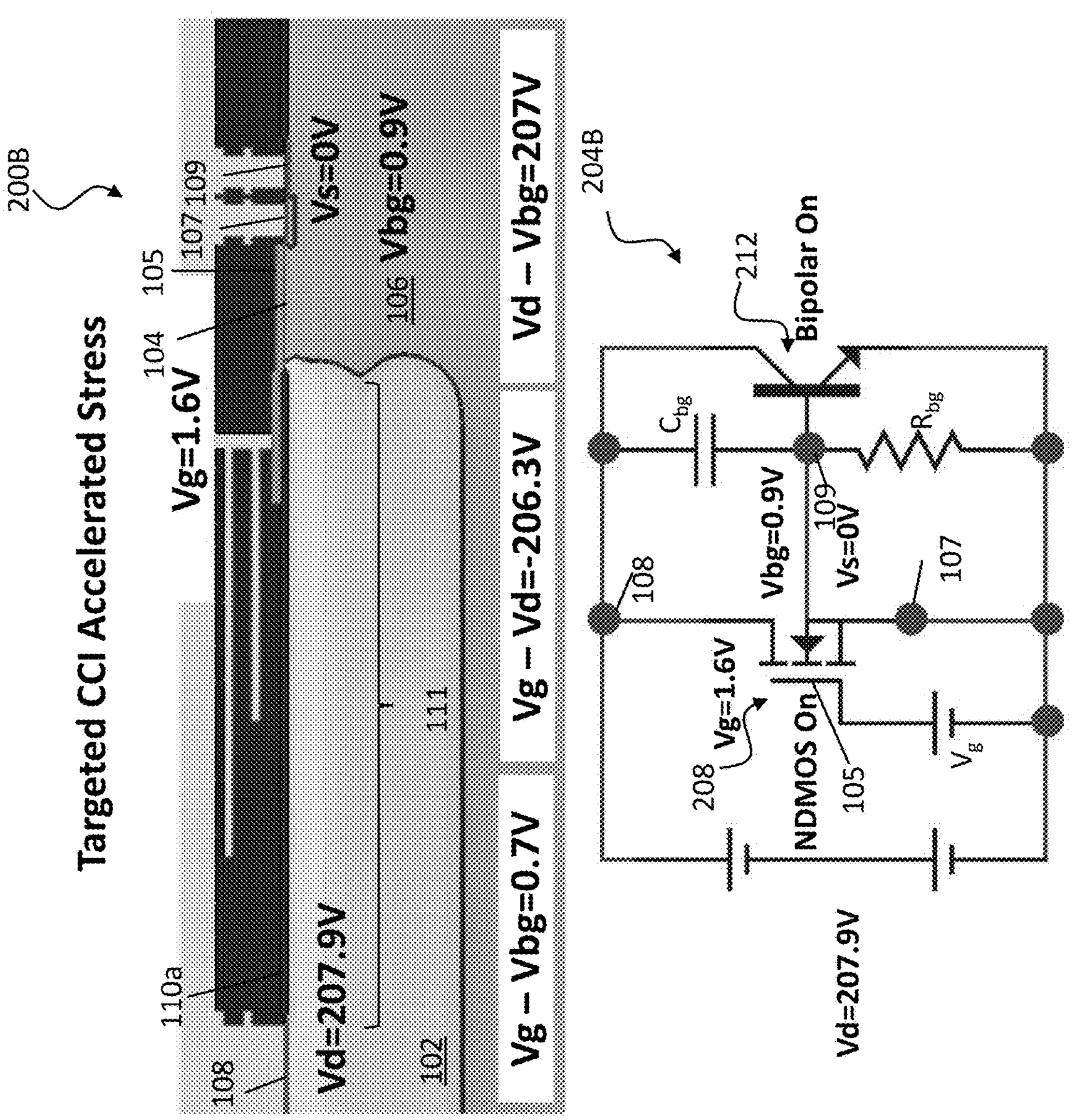
FIG. 2B illustrates a cross-sectional view and circuit diagram of the semiconductor device illustrated in FIG. 2A with an example biasing scheme under an accelerated stress mode in which the backgate region is actively biased to be different from the source, according to embodiments.

FIGS. 2A and 2B illustrate cross-sectional views and circuit diagrams of semiconductor devices 200A and 200B with example biases on various terminals representative of a product mode and an accelerated stress mode, respectively. The semiconductor devices 200A and 200B are each configured similarly to the semiconductor device 100 illustrated with respect to FIG. 1A. The semiconductor devices 200A and 200B are also illustrated as circuit diagrams 204A and 204B in FIGS. 2A and 2B, respectively. Features in FIGS. 2A and 2B that correspond to similar features in FIGS. 1A-1B may be represented with the same reference numerals. In addition, the circuit diagrams 204A and 204B are also labeled with corresponding reference numerals. As illustrated in the circuit diagrams 204A and 204B, the semiconductor devices 200A and 200B includes an LDMOS transistor 208 and a bipolar junction transistor (BJT) 212 that are electrically connected to each other.

Referring to the circuit diagrams 204A, 204B, the BJT 212 comprises an emitter, base and a collector of the BJT that are electrically connected to the source 107, the backgate region 106 and the drain 108, respectively, of the LDMOS transistor 208. The emitter of the BJT 212 is electrically connected to, or share the same heavily n+ region serving as, the source 107 of the LDMOS transistor 208. The base of the BJT 212 is electrically connected to, or share the same p-doped well serving as, the backgate region 106 of the LDMOS transistor 208. The collector of the BJT 212 is electrically connected to, or share the n+ region serving as, the drain 108 of the LDMOS transistor 208. Thus configured BJT 212 is a NPN BJT transistor. The backgate region 106 can be represented to have a backgate resistor $R_{bg}$ and a backgate capacitor $C_{bg}$ between the backgate region 106 and the source 107 and between the backgate region 106 and the drain 107, respectively.

FIG. 2A illustrate a cross-sectional view 200A and a circuit diagram 204A of a semiconductor device with an example biasing scheme under a product mode. Under this mode, both the source voltage ($V_s$) and the backgate voltage ($V_{bg}$) are set to be at the same potential, e.g., at ground potential. Under this condition, the BJT 212 is unactivated, and no excess holes are injected from the base region of the BJT 212 into the backgate region 106. Under this product mode, the semiconductor device 200A operates in a manner similar to as described above with respect to FIGS. 1A-IE, where holes may be generated near the dielectric junction 110*d* (FIG. 1B) between the relatively thick isolation region 110*a* and the gate dielectric 110*c*. As described above, the LDMOS transistor 208 is activated by inducing a conductive channel 104 between the source 107 and the drain 108 or the extended drain drift region 111 of the LDMOS transistor 208 under a gate bias ($V_g$) on the gate 105. The carriers forming the conductive channel 104 are electrons formed by inversion of the surface of the p-well, which are also referred to herein as channel current carriers. When the LDMOS transistor 208 is activated, the electrons flow in the channel 104 from the source 107 to the drain 108 under a bias between the source 107 and the drain 108. However, as described above, the drift of electrons in the extended drain drift region 106 also generates carriers of the opposite charge type to channel current carriers (holes in n-channel devices) by weak impact ionization. At the high field region 122 (FIG. 1A-1D) including the dielectric junction 110*d* between the isolation region 110*a* and the gate dielectric 110*c*, the upward pointing electric field attracts holes from the extended drain drift region 111 toward the gate 105, which may undesirably be injected into and/or trapped in the gate dielectric 110*c*, thereby weakening or rupturing the gate dielectric 110*c*.

The same voltage applied to both the source 107 and the backgate region 106 as described herein can be implemented in multiple ways. In one implementation, each of the source 107 and the backgate region 106 may be commonly grounded. For example, a common electrical connection formed by, e.g., an electrically switch shorting the electrical connections to the backgate contact via 109*a* and source contact via 107*a* (FIG. 1A), may be used to apply the ground voltage to both the source 107 and the backgate region 106. Alternatively, independent electrical connections to electrically separated backgate contact via 109*a* and source contact via 107*a*, can be used to independently ground the source 107 and the backgate region 106.

FIG. 2B illustrates a cross-sectional view 200B and a circuit diagram 204B of the same semiconductor device illustrated in FIG. 2A with an example biasing scheme under an accelerated stress mode. Under this mode, the backgate region 106 is actively and independently biased to be different from the source 107. Notably, unlike the product mode described above with respect to FIG. 2A, the source voltage ($V_s$) and the backgate voltage ($V_{bg}$) are set to be different. For example, the $V_{bg}$ is set to be at a higher potential than the $V_s$, which can be at ground potential. Under this condition, the BJT 212 is activated, and a substantial concentration of excess holes are injected from the base of the BJT into the backgate 106 of the LDMOS transistor 208. That is, unlike the product mode, the backgate region 106 of the LDMOS transistor 208 is independently biased from the source 107, and the concentration of holes in the backgate region 106 may be controlled by controlling the bias on the backgate region 106, which simultaneously serves as the base of the BJT 212, for activating the BJT 212. The p-well formed in the substrate 101 includes or serves as the backgate region 106 of the LDMOS transistor 208 and the base of the BJT 212, and is configured to be biased independently through the backgate contact via 109*a* formed on the p-well. The backgate contact via 109*a* may be controlled independently from other terminals including the source 107, e.g., through a dedicated backgate contact via 109*a* (FIG. 1A) and/or a dedicated voltage source electrically connected thereto. Upon activation of the BJT 212, the base thereof injects holes into the backgate region 106 at concentrations exceeding that in the product, e.g., by more than two orders of magnitude relative to the product mode in which the BJT 212 is not activated, as described above with respect to FIG. 2A. By injecting holes into the backgate region 106, the BJT 212 increases the hole density in the backgate region 106, which are majority carriers in the backgate region 106. These holes travel towards the gate dielectric 110*a* above the extended drain drift region 111, and once in the high field region 122, they can be injected into the gate dielectric 110*c* due to the electric field strength and direction as described above.

Still referring to FIG. 2B, during the accelerated stress mode, the LDMOS transistor 208 is activated by inducing a conductive channel 104 between the source 107 and the drain 108 of the LDMOS transistor 208 under a gate bias ($V_g$) that is higher than the $V_g$ used during the product mode. Further, the normally off or dormant BJT 212 is activated by applying a bias to the backgate region 106 of the LDMOS transistor 208 that serves as a base of the BJT 212, thereby injecting excess holes into the backgate region 106.

Referring to FIGS. 2A and 2B, as described above, the source 107 and the backgate region 106 are biased differently in the semiconductor device 200A under product mode versus the semiconductor device 200B under the accelerated stress mode. That is, advantageously, the same device may be implemented to function in either and interchangeably between the product mode and the accelerated stress mode. As described above, the source 107 and the backgate region 106 are under the same voltage condition in the product mode, whereas during the accelerated stress mode, the source 107 and the backgate region 106 are provided with independent and different voltages. The operation of the same device interchangeably under the two different modes is enabled in part by the independently accessible backgate region 106 through, e.g., the backgate electrical contact via 109*a* (FIG. 1A) that is not electrically connected to other terminals such as the source contact via 107*a* (FIG. 1A). In some implementations the backgate region 106 may be connected to a separate or dedicated voltage source to provide the independent bias. Advantageously, such configuration can be implemented such that the LDMOS transistor 208 is operated to have essentially the same relative biases between the gate 105, the drain 108 and the backgate region 106. For example, as illustrated in FIGS. 2A and 2B, despite the different $V_g$ and $V_d$ between the product (FIG. 2A) and accelerated stress (FIG. 2B) modes, the magnitudes of the gate-backgate bias ($V_g$–$V_{bg}$), the gate-drain bias ($V_g$–$V_d$) and drain-backgate bias ($V_d$–$V_{bg}$) are substantially the same between the two modes. As used herein, voltages that are substantially the same are within about 10% of each other. As a result, the acceleration of the gate dielectric degradation can be performed under these device biases that are very similar to those during actual usage in the product mode, while providing the increased concentration of holes for injection into the gate dielectric 110*c* to accelerate the degradation or failure. Thus, the electric field under which the holes being injected into the gate dielectric 110*c* in the high field region 122 are subjected to can be configured to be substantially the same between the two. As used herein, electric fields that are substantially the same are within about 10% of each other. Such configuration is advantageous for various reasons. For example, degradations or failures induced under the accelerated stress mode can be more confidently attributed to the hole injection into the gate dielectric 110*c* as described above for accurate troubleshooting and mitigation, while more confidently ruling out other failures that may arise from a difference in ($V_g$–$V_{bg}$), ($V_g$–$V_d$) and ($V_d$–$V_{bg}$) between the two modes, e.g., hot carrier injection.

In the illustrated bias scheme illustrated in FIG. 2A by way of example only for the semiconductor device 200A under a product mode, the gate voltage ($V_g$) applied to the gate 105 may be 0.7V; the drain voltage ($V_d$) applied to the drain 108 may be 207V; the backgate voltage ($V_{bg}$) applied to the backgate region 106 may be ground voltage; and a source voltage ($V_s$) applied to the source 107 may be ground voltage. Comparatively, for the semiconductor device 200B under an accelerated stress mode, the gate voltage ($V_g$) applied to the gate 105 may be 1.6V; the drain voltage ($V_d$) applied to the drain 108 may be 207.9V; the backgate voltage ($V_{bg}$) applied to the backgate region 106 may be 0.9V; and the source voltage ($V_s$) applied to the source 107 may be ground voltage. As described above, during operation in the accelerated stress mode, $V_s$ and $V_{bg}$ are different. Advantageously, as illustrated in FIGS. 2A and 2B, despite the different $V_g$ and $V_d$ between the product and accelerated stress modes, the magnitudes of gate-backgate bias ($V_g$–$V_{bg}$), gate-drain bias ($V_g$–$V_d$) and the drain-backgate bias ($V_d$–$V_{bg}$) are substantially the same between the two modes. As a result, the gate dielectric degradation can be accelerated while relevant biases for hole injection are substantially the same between the two modes.

It will be understood that the example bias conditions in FIGS. 2A and 2B are provided by way of illustration only to provide one concreate example. However, it will be appreciated that any suitable bias scheme can be applied while achieving similar results with respect to ($V_g$–$V_{bg}$), ($V_g$–$V_d$) and ($V_d$–$V_{bg}$) being substantially equal between the two modes. For example, the biasing schemes can be used with any MOS, DMOS or LDMOS device configured for drain-source voltage ($V_d$–$V_s$) of 1-350V, 1-50V, 50-100V, 100-150V, 150-200V, 200-250V, 250-300V or a voltage in a range defined by any of these values, and gate-source voltage ($V_g$–$V_s$) of 1-20V, 1-4V, 4-8V, 8-12V, 12-16V, 16-20V, or a voltage in a range defined by any of these values.

Advantageously, because the backgate region 106 of the LDMOS transistor 208 that serves as the base of the BJT 212 is independently accessible, the amount of excess holes that are injected into the backgate region 106 and available for accelerated stressing of the gate dielectric 110*c* can be adjusted in the accelerated stress mode by adjusting the bias on the backgate 106 serving as the base of the BJT 212. For example, the $V_{bg}$ applied to the backgate region 106 can be increased while adjusting the $V_g$ and $V_d$ upwards by the same amount the $V_{bg}$ was increased by. The is that the ($V_g$–$V_{bg}$), ($V_g$–$V_d$) and ($V_d$–$V_{bg}$) can be kept constant between the product and the accelerated stress modes while increasing the hole density in the accelerated stress mode relative to the product mode by more than two orders of magnitude.

For illustrative purposes only and without loss of generality, the semiconductor device described above with respect to FIGS. 2A-2B includes an nLDMOS 208 and a NPN BJT 212. As configured, the degradation and/or failure of the gate dielectric 110*c* may be caused by holes injected from the n-doped extended drain drift region 111 into the gate dielectric 110*c* under an electric field directed from the extended drain draft region 111 toward the gate electrode 105 that is biased with a positive voltage. However, a skilled artisan would recognize that the inventive concepts described herein can be analogously applied to an analogous semiconductor device which includes a p-channel LDMOS and a PNP BJT. In such a device, the degradation and/or failure of the gate dielectric may be caused by electrons injected from a p-doped extended drain drift region into the gate dielectric under an electric field directed from the gate electrode that is biased with a negative voltage toward the extended drain draft. Similarly, the excess carrier injected in the backgate region of the p-channel LDMOS transistor from the base of the PNP BJT would analogously be electrons.

Figure 3:
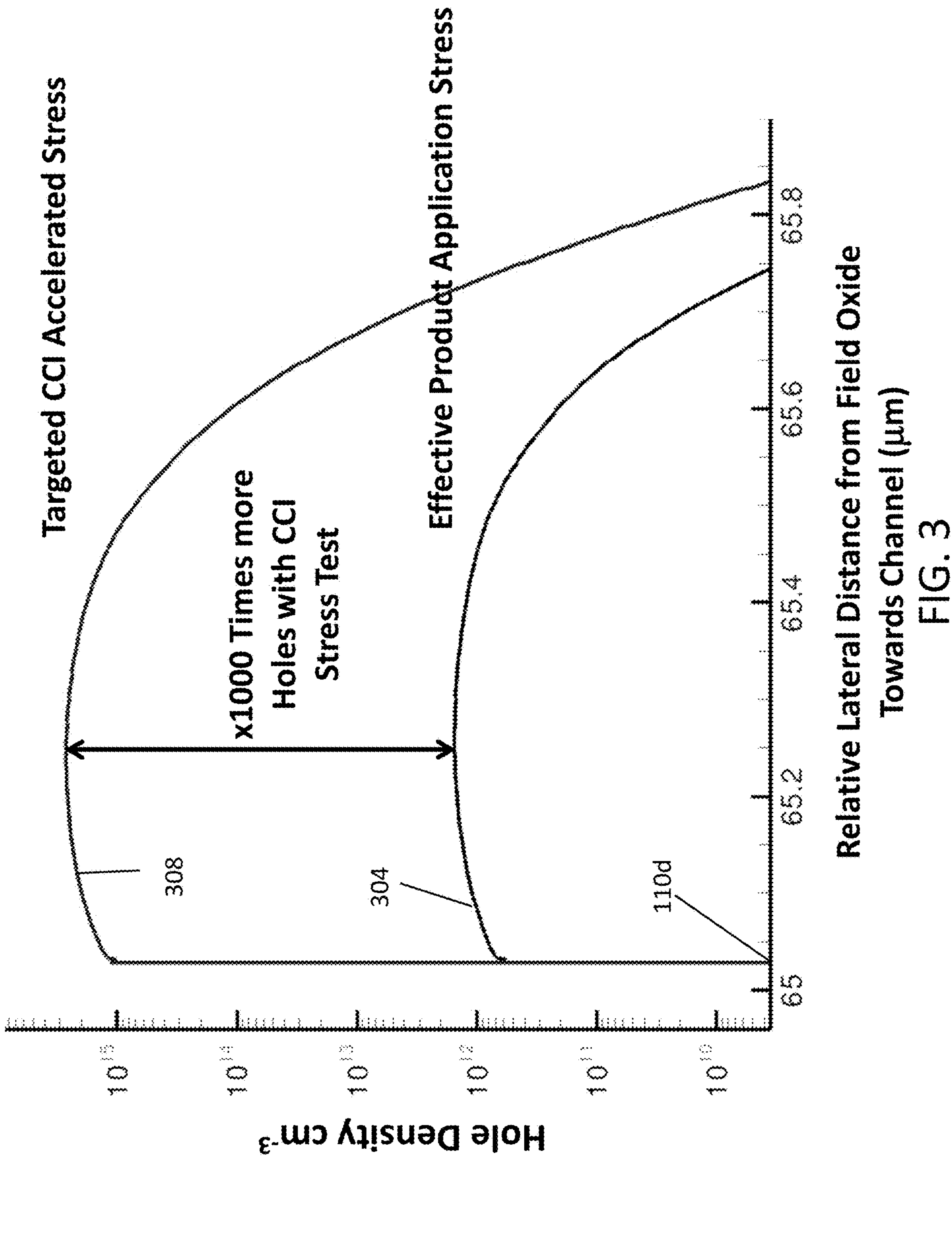
FIG. 3 is a graph comparing spatial distributions of the hole density between the product mode illustrated in FIG. 2A and the accelerated stress mode illustrated in FIG. 2B.

As described above, the semiconductor device according to embodiments advantageously allows the hole concentration in the backgate region to be controllably increased, which correspondingly increases the hole concentration available for injection into the gate dielectric 110*c* above the extended drain drift region 111, as described above with respect to FIGS. 1A-1D and 2A-2B. FIG. 3 is a graph comparing spatial distributions 304 and 308 of the hole density between the product mode illustrated in FIG. 2A and the accelerated stress mode illustrated in FIG. 2B, respectively, in the high field region 122 (FIG. 1A) near the dielectric junction 110*d* (FIG. 1B). The top curve 308 illustrates the hole density versus relative position of the device under the accelerated stress mode, where the BJT 212 is activated, as described above with respect to FIG. 2B. The bottom curve 304 illustrates the hole density versus relative position of the device under the product mode, where the BJT is not activated. As illustrated, the difference in the hole density between the two modes can be as much as three orders of magnitude, depending on the distance from the dielectric junction 110*d*. Thus, the holes that are available for injection into the gate dielectric 110*c* are correspondingly increased to accelerate the degradation or induce failure of the gate dielectric 110*c*.

Figure 4A:
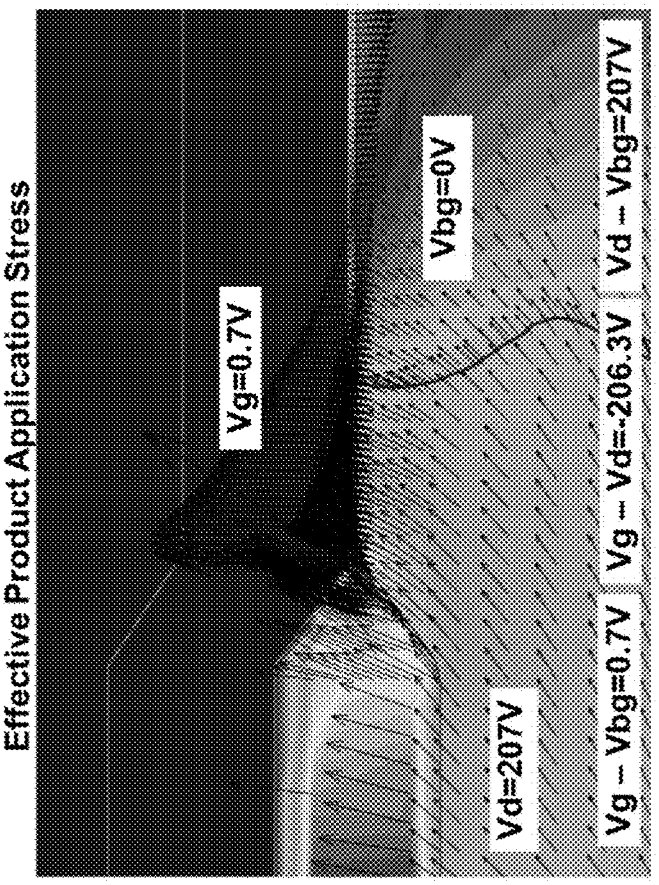
FIGS. 4A and 4B illustrate simulated spatial distributions of the relative intensities and directions of the electric fields in the high field region under the product mode described above with respect to FIG. 2A and the accelerated stress mode described above with respect to FIG. 2B, respectively.
Figure 4B:
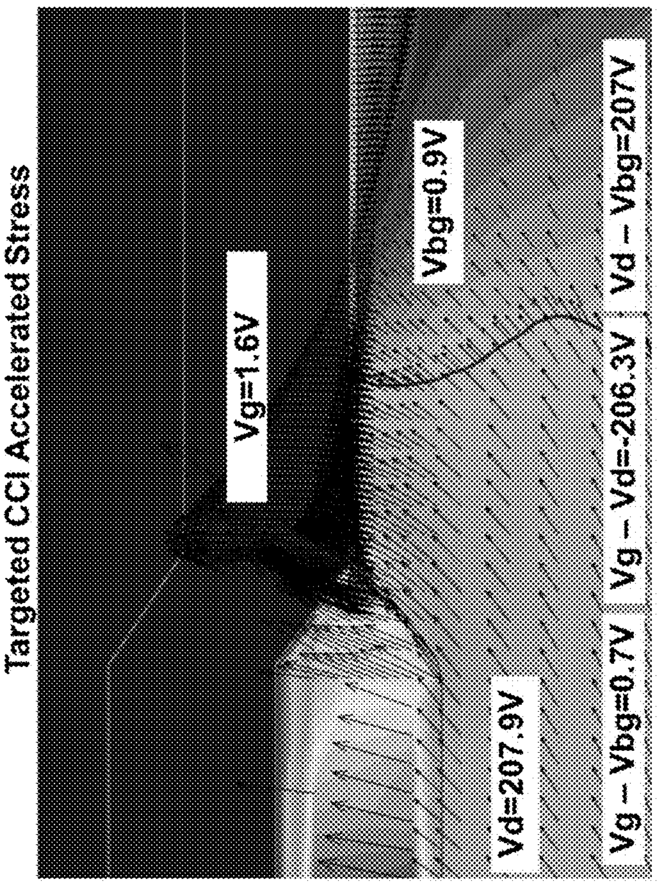

FIGS. 4A and 4B illustrate simulated spatial distributions of the relative strengths and directions of the electric fields in the high field region 122 (FIGS. 1A and 1B) under the product mode described above with respect to FIG. 2A and the accelerated stress mode described above with respect to FIG. 2B, respectively. Similar to FIG. 1D, the lengths of the arrows indicate the relative strengths and the directions of the arrows indicate the direction of the electric field at various locations. As described above with respect to FIG. 1D, because of the relatively steep reduction in thickness of the dielectric from the isolation region 110*a* to the gate dielectric 110*c*, there exists a correspondingly steep increase in the electric field 126 (FIG. 1B) in the high field region 122 over the extended drain drift region 111. The holes subjected to this electric field may be injected into gate dielectric 110*c* as described above, thereby causing at least some of the holes to be trapped in the gate dielectric 110*c*, leading to a degradation and/or failure of the gate dielectric 110*c*. Advantageously, as FIGS. 4A and 4B illustrate, because the ($V_g$–$V_{bg}$), ($V_g$–$V_d$) and ($V_d$–$V_{bg}$) are kept constant between the product and accelerated stress modes, the spatial distributions of the electric field are substantially similar between the product mode and accelerated stress mode. As described above, the result is particularly advantageous because the gate dielectric degradation can be substantially accelerated in the accelerated stress mode while keeping spatial distribution of electric field to be substantially the same as that in the product mode.

Figure 5:
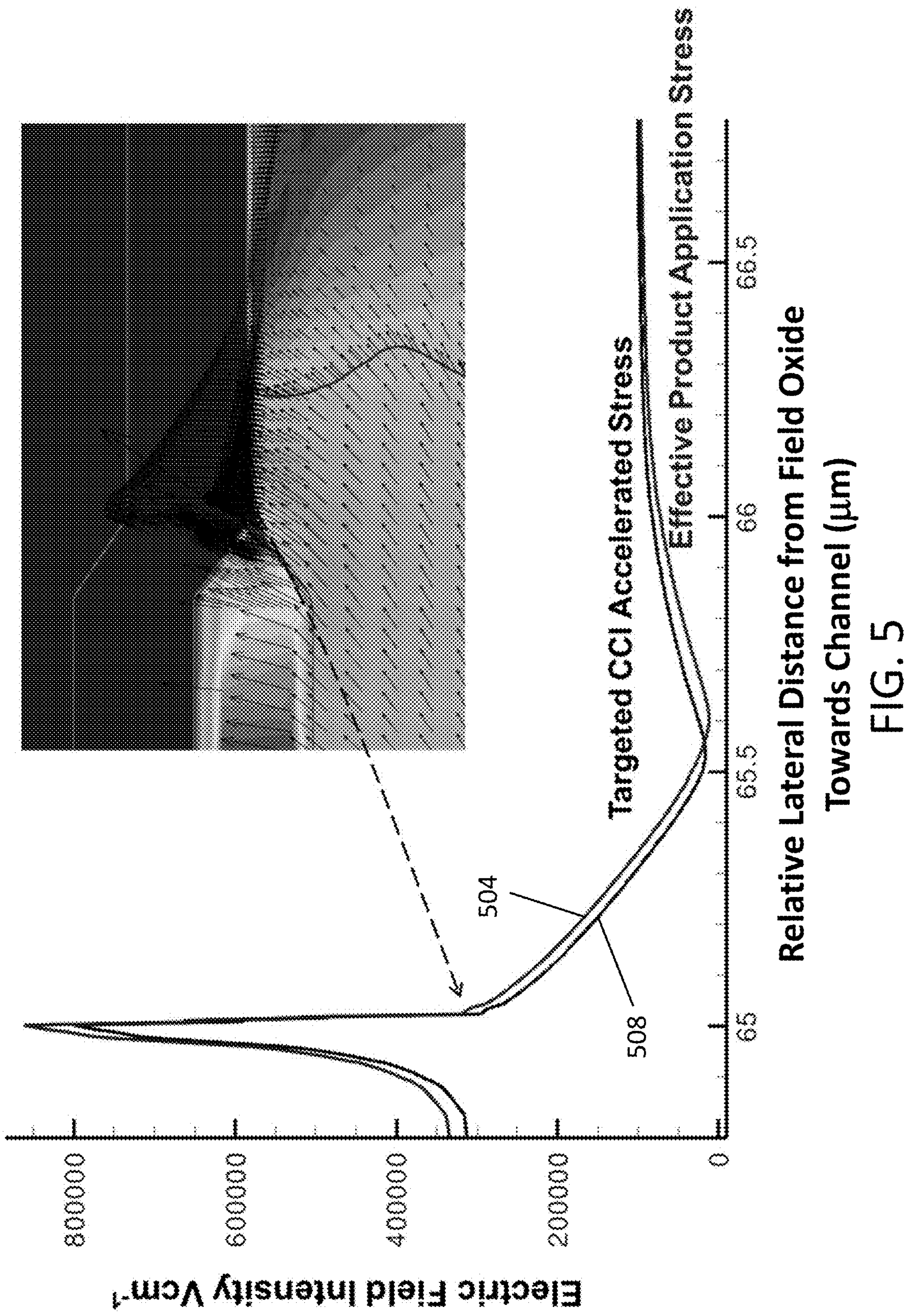
FIG. 5 illustrates simulated spatial distributions of the intensities of the electric field in the high field region under the product mode described above with respect to FIG. 2A and the accelerated stress mode described above with respect to FIG. 2B.

The substantially similar spatial distributions of electric field between the product mode and the accelerated stress mode is further illustrated in FIG. 5. Electric field intensity curves 504 and 508 illustrate simulated spatial distributions of the electric field in the high field region 122 (FIGS. 1A and 1B) under the product mode described above with respect to FIG. 2A and the accelerated stress mode described above with respect to FIG. 2B, respectively. Similar to the results described with respect to FIGS. 4A and 4B, FIG. 5 illustrates that the spatial distributions of electric field can be substantially the same between the product and accelerated stress modes despite the substantially higher concentration of holes (FIG. 3) that are available for gate dielectric degradation under the accelerated stress mode.

Figure 6:
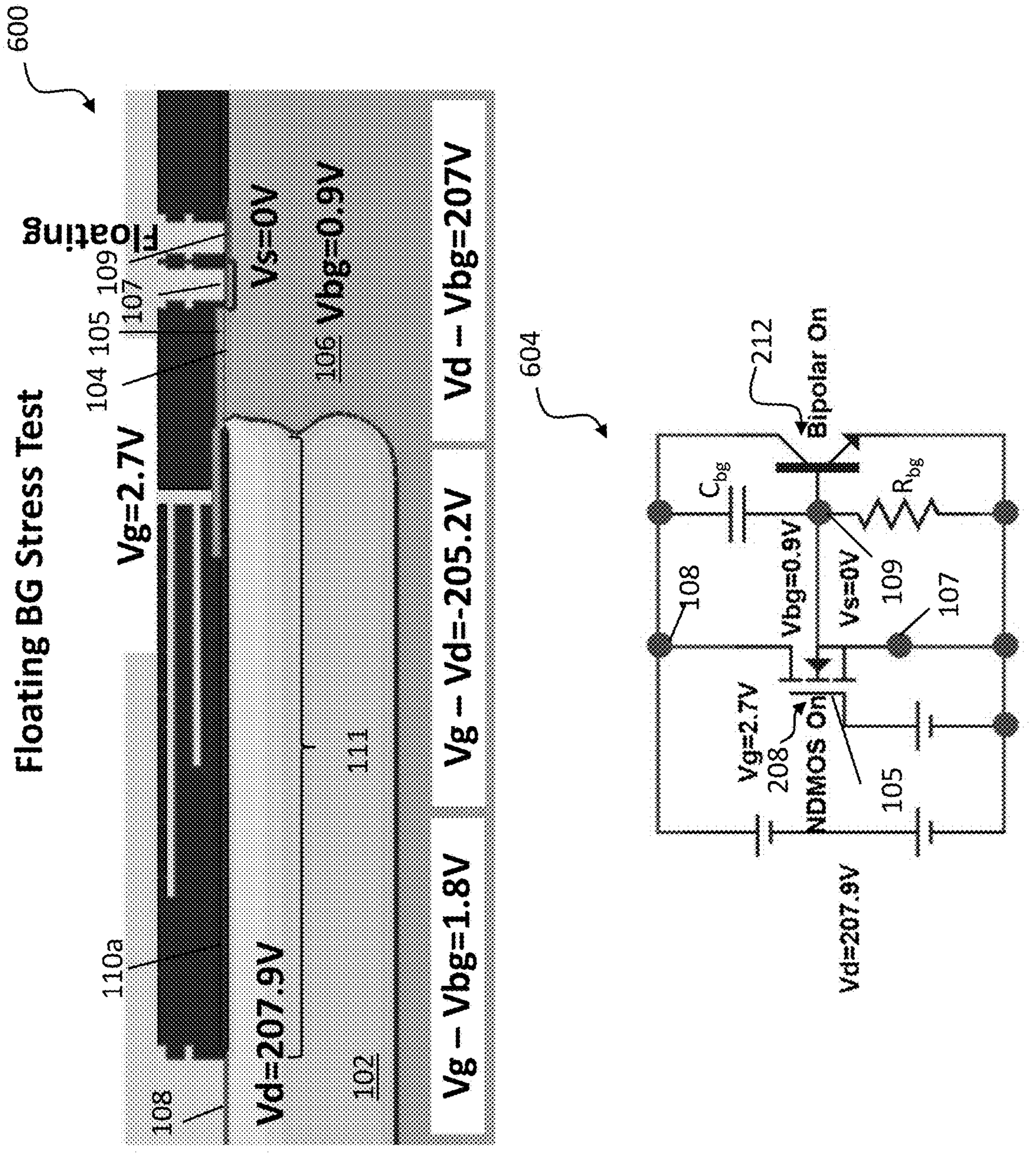
FIG. 6 illustrates a cross-sectional view and circuit diagram of the semiconductor device illustrated in FIG. 2A with an example biasing scheme under an accelerated stress mode in which the backgate region is electrically floated, according to embodiments.

Referring to FIG. 6, example biases under an accelerated stress mode according to an alternative embodiment are illustrated. Notably, unlike the product mode illustrated in FIG. 2A, the source voltage ($V_s$) and the backgate voltage ($V_{bg}$) are set to be different. However, unlike the accelerated stress mode illustrated in FIG. 2B, the backgate region 106 is electrically floated. The $V_g$ is set to be at a higher than that in the accelerated stress mode illustrated in FIG. 2B. Under the accelerated stress mode configuration illustrated of FIG. 6, the $V_{bg}$ is pulled up to a potential higher than the $V_s$, which can be at ground potential, and similar in magnitude to the configuration of FIG. 2B. That is, the $V_{bg}$ is pulled up to a sufficient bias such that the BJT 212 is activated, thereby injecting a substantial amount of excess holes from the base of the BJT 212 into the backgate region 106 of the LDMOS transistor 208, such that the result is similar to that described above with respect to FIG. 2B. Unlike the example illustrated in FIG. 2B, the concentration of holes in the backgate region 106 is controlled indirectly by controlling the $V_{bg}$ through the $V_g$ on the gate 105. The backgate region 106 may be independently connected from other terminals including the source 107, e.g., through a dedicated backgate contact via 109*a* (FIG. 1A), which may be electrically floated. The base of thus activated BJT 212 injects holes to the backgate region 106 at concentrations exceeding two orders of magnitude relative to the product mode in which the BJT 212 is not activated, as described above with respect to FIG. 2A. In a similar manner as described above with respect to FIG. 2B, the holes travel towards the gate dielectric 110*a* above the extended drain drift region 111, and can be injected into the gate dielectric 110*c* to accelerate the degradation thereof. Referring to FIG. 2A and FIG. 6, as described above, the source 107 and the backgate 106 are biased differently in the semiconductor device 200A under product mode versus the semiconductor device 600 under the accelerated stress mode. The operation of the same device under the two different modes is enabled in part by an independently connected back-bias region 106 that can be electrically floated through, e.g., the backgate electrical contact 109*a* that is not electrically connected to other terminal such as the source contact via 107*a* (FIG. 1A). The backgate electrical contact via 109*a* may be connected to a separate or dedicated terminal that can be electrically floated. Advantageously, such configuration can be implemented such that the LDMOS transistor 208 can be operated to have essentially the same drain-backgate bias ($V_d$–$V_{bg}$). As a result, while the increased concentration of holes are injected into the gate dielectric 110*c* to accelerate the degradation thereof, the electric field which the holes being injected into the gate dielectric are subjected to can be substantially the same between the two modes. Such configuration is advantageous for similar reasons as described above with respect to FIGS. 2A and 2B.

By way of illustrative example only for the semiconductor device 600 under an accelerated stress mode, the gate voltage ($V_g$) applied to the gate 105 may be 2.7V; the drain voltage ($V_d$) applied to the drain 108 may be 207.9V; the backgate voltage ($V_{bg}$) achieved by electrically floating the backgate region 106 may be 0.9V; and the source voltage ($V_s$) applied to the source 107 may be ground voltage. As described above, during operation in the accelerated stress mode, $V_s$ and $V_{bg}$ are different. Advantageously, as illustrated in FIGS. 2A and 6, despite the different $V_g$ and $V_d$ between product and accelerated stress modes, the magnitude of the drain-backgate bias ($V_d$–$V_{bg}$) is substantially the same between the two modes. As a result, the gate dielectric degradation can be accelerated without subjecting the injected holes to electric fields that are different between the two modes.

Figure 7B:
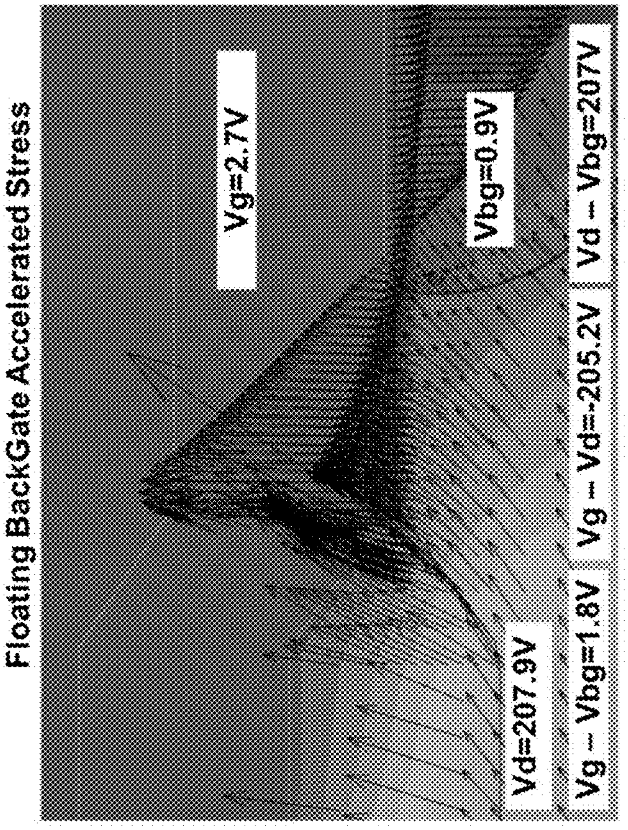
FIGS. 7A and 7B illustrate simulated spatial distributions of the relative intensities and directions of the electric fields in the high field region under the product mode described above with respect to FIG. 2A and the accelerated stress mode described above with respect to FIG. 6, respectively.
Figure 7A:
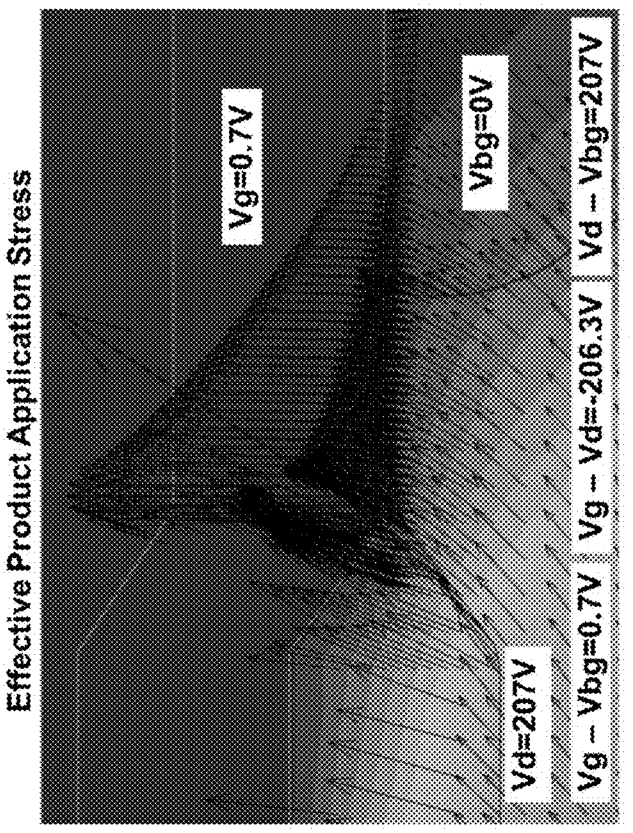

FIGS. 7A and 7B illustrate simulated spatial distributions of the relative strengths and directions of the electric fields in the high field region 122 (FIGS. 1A and 1B) under the product mode described above with respect to FIG. 2A and the accelerated stress mode described above with respect to FIG. 6, respectively. The lengths of the arrows indicate the relative strengths and the directions of the arrows indicate the directions of the electric field at various locations. Advantageously, as illustrated in FIGS. 7A and 7B, because the ($V_d$–$V_{bg}$) is kept relatively constant between the product and accelerated stress modes, the spatial distribution of the electric field is advantageously substantially similar in the high field region 122 (FIGS. 1A and 1B) between the product mode and accelerated stress. As described above, the result is particularly advantageous because the spatial distributions of electric field in the high field region can be substantially the same between the product and accelerated stress mode despite the substantially higher concentration of holes (FIG. 3) under the accelerated stress mode relative to the product mode.

It will understood that while the example discussed above pertains to a DMOS device, a skilled artisan would appreciate that the disclosure could be adapted to use in any metal-oxide-semiconductor transistor (MOS) that includes a source, drain, and a backgate region where there are issues of carriers of the opposite charge type to channel current carriers tunneling into the gate dielectric. In a MOS, the source and the drain are heavily doped regions and a channel is doped with a dopant of opposite charge than that of the source and/or drain. In some implementations, the MOS has an extended drain drift region that could be a lightly doped region with a similar dopant type as that of the drain. As discussed above, the backgate region and the source are independently accessible in order to enable activation of a BJT and increase injection of carriers of the opposite charge type to channel current carriers, e.g., holes in n-channel devices, into the backgate region. Further, it will be appreciated that the injection of carriers of the opposite charge type to channel current carriers, e.g., holes, accelerates gate dielectric failure.

Additional Examples

1. A semiconductor device configured with gate dielectric monitoring capability comprising:
   - a metal-oxide-semiconductor (MOS) transistor including a source, a drain, a gate, and a backgate region formed in a semiconductor substrate; and
   - a bipolar junction transistor (BJT) including a collector, a base, and an emitter formed in the semiconductor substrate, wherein the backgate region of the MOS transistor serves as the base of the BJT and is independently accessible for activating the BJT,
   - wherein the MOS transistor and the BJT are configured to be concurrently activated by biasing the backgate region independently from the source of the MOS transistor, such that the base of the BJT injects carriers of a first charge type into the backgate region of the MOS transistor, the first charge type being opposite charge type to channel current carriers.

2. The semiconductor device of Embodiment 1, wherein the MOS transistor is a double diffused metal-oxide-semiconductor (DMOS) transistor.

3. A semiconductor device comprising a double diffused metal-oxide-semiconductor (DMOS) transistor configured to accelerate degradation of a gate dielectric of the DMOS transistor while the DMOS transistor is operated under target product bias conditions by supplying excess majority carriers to a backgate region of the DMOS transistor using a bipolar junction transistor (BJT).

4. A semiconductor device comprising a double diffused metal-oxide-semiconductor (DMOS) transistor and a bipolar junction transistor (BJT) formed in a semiconductor substrate, wherein a well of a first type serving both as a backgate region of the DMOS transistor and as a base of the BJT is configured to be biased independently through a separate well contact, wherein the DMOS transistor and the BJT are configured to be concurrently activated by biasing the backgate region independently from a source of the DMOS transistor.

5. The semiconductor device of any of the above Embodiments, wherein upon activation, the BJT injects the carriers of the first type to cause an acceleration of a degradation or a failure of a gate dielectric of the DMOS transistor.

6. The semiconductor device of any of the above Embodiments, wherein the source of the DMOS transistor serves as the emitter of the BJT, and wherein the drain of the DMOS transistor is electrically connected to the collector of the BJT.

7. The semiconductor device of any of the above Embodiments, wherein the DMOS transistor is an n-channel DMOS transistor such that the carriers of the first type injected to the backgate region are holes.

8. The semiconductor device of any of the above Embodiments, wherein the DMOS transistor comprises an extended drain drift region formed in the substrate and covered by a field oxide between the drain and a channel of the DMOS transistor, wherein the extended drain drift region is doped with the same dopant type as the drain at a lower dopant concentration compared to the drain.

9. The semiconductor device of any of the above Embodiments, further comprising:

a first contact electrically connected to the source and configured for applying a source voltage (Vs) to the source; and a second contact electrically connected to the backgate region and configured for applying a backgate voltage (Vbg) to the backgate region, wherein the semiconductor device is configured to be interchangeably operated between a gate dielectric test mode and a product mode in which different backgate voltages are applied to the second contact.

10. The semiconductor device of any of the above Embodiments, wherein the semiconductor device is configured such that in the product mode, the Vs and the Vbg having same magnitudes are applied, whereas in the gate dielectric test mode, the Vs and the Vbg having the different magnitude are applied.

11. The semiconductor device of any of the above the above Embodiments, wherein the first contact and the second contact are electrically separated from each other such that the semiconductor device is configured to apply the Vs and the Vbg independently of each other.

12. The semiconductor device of any of the above Embodiments, further comprising a third contact commonly electrically connected to the source and the backgate region and configured for applying a common voltage to both the source and the backgate region such that the semiconductor device is operated in the product mode.

13. The semiconductor device of any of the above Embodiments, wherein in the product mode, the common voltage to the source and the backgate is a ground voltage.

14. The semiconductor device of any of the above Embodiments, wherein the backgate region of the DMOS and the base of the BJT are accessible through a dedicated contact formed on the substrate.

15. A method of monitoring a gate dielectric of a metal-oxide-semiconductor (MOS) transistor, the method comprising:

activating the MOS transistor by inducing a conductive channel between a source and a drain of the MOS transistor under a gate bias; and activating or deactivating a bipolar junction transistor (BJT) by applying a suitable bias to a backgate region of the MOS transistor that serves as a base of the BJT and is independently accessible for activating the BJT, thereby injecting carriers of a first type to the backgate region, the carriers of the first type being opposite charge type to channel current carriers.

16. The method of Embodiment 15, wherein the MOS transistor is a double diffused metal-oxide-semiconductor (DMOS) transistor.

17. The method of Embodiment 16, wherein activating the DMOS transistor and activating the BJT comprises:

applying a first voltage to the drain of the DMOS transistor, wherein the drain is electrically connected to a collector of the BJT;

applying a second voltage to the backgate region of the DMOS transistor, wherein the backgate region of the DMOS serves as the base of the BJT; and applying a third voltage to a source of the DMOS, wherein the source of the DMOS transistor serves as an emitter of the BJT, wherein the first, second, and third voltages are different.

18. The method of Embodiment 17, wherein the first voltage is 0V to 240V, the second voltage is 0.5V to 5.5V, and the third voltage is 0V to 5V.

19. The method of Embodiment 17, wherein the second voltage is higher than the third voltage by greater than or equal to 0.5V.

20. The method of any of Embodiments 15-19, further comprising applying a fourth voltage to a gate of the MOS transistor.

21. The method of Embodiment 20, wherein the fourth voltage is 0V to 5V.

22. The method of any of Embodiments 15-21, wherein applying the second voltage to the backgate region activates the BJT and injects the carriers of the first type to the backgate region.

23. The method of any of Embodiments 15-22, wherein the MOS transistor is an n-channel MOS transistor such that the carriers of the first type injected to the backgate region are holes.

24. The method of any of Embodiments 15-23, further comprising increasing the second voltage to the backgate region to increase the carriers of the first type.

25. The method of any of Embodiments 15-24, further comprising applying a ground voltage to both the source and the backgate region of the MOS transistor.

26. The method of Embodiment 25, wherein applying the ground voltage is performed during normal operation of the MOS transistor.

27. A method of using a semiconductor device which includes a double diffused metal-oxide-semiconductor (DMOS) transistor, the method comprising:

activating the DMOS by inducing a conductive channel between a source and a drain of the DMOS under a gate bias; and flowing a current of a first type of carrier through the conductive channel by applying a bias between the source and the drain, wherein by flowing the current of a first type of carrier, a current of a second type of carrier opposite the first charge type of the first type of carrier flows in the opposite direction, and wherein the current of the second type of carrier causes a failure of a gate dielectric of the DMOS.

28. The method of Embodiment 26, wherein activating the DMOS comprises:

applying a first voltage to the drain of the DMOS;

applying a second voltage to the backgate of the DMOS;

applying a third voltage to the source of the DMOS, wherein the second voltage and the third voltage are the same voltage; and applying a fourth voltage to the gate of the DMOS.

29. The method of any of Embodiments 27 or 28, further comprising activating a bipolar junction transistor (BJT) by applying a bias to a backgate region of the DMOS transistor that serves as a base of the BJT and is independently accessible for activating the BJT, thereby injecting carriers of the second type to the backgate region.

30. The method of Embodiment 29, wherein activating the DMOS transistor and activating the BJT comprises:

applying the first voltage to the drain of the DMOS transistor, wherein the drain is electrically connected to a collector of the BJT;

applying a fifth voltage to the backgate region of the DMOS transistor, wherein the backgate region of the DMOS serves as the base of the BJT; and applying the third voltage to the source of the DMOS transistor, wherein the source of the DMOS transistor serves as an emitter of the BJT and wherein the first, third, and fifth voltages are different.

31. The method of any of Embodiments 27 or 28, further comprising statistically testing the device by activating the BJT and then activating the DMOS transistor in order to test device performance.

32. A semiconductor device comprising:

a double diffused metal-oxide-semiconductor (DMOS) transistor including a source, a drain, a gate, and a backgate region formed in a semiconductor substrate;

a first contact configured to apply a first voltage to the gate;

a second contact configured to apply a second voltage to the drain;

a third contact configured to apply a third voltage to the source; and a fourth contact configured to apply a fourth voltage to the backgate, wherein the third voltage and the fourth voltage are different.

33. The semiconductor device of Embodiment 32, further comprising a fifth contact configured to apply a fifth voltage to both the source and the backgate.

34. The semiconductor device of any of Embodiments 32 or 33, wherein the fifth voltage is a ground voltage.

35. The semiconductor device of any of Embodiments 32-34, further comprising a bipolar junction transistor (BJT) including a collector, a base, and an emitter formed in the semiconductor substrate, wherein the backgate region of the DMOS transistor serves as the base of the BJT and is independently accessible for activating the BJT, and wherein upon activation of the BJT, the base injects carriers of a first type to the backgate region, the carriers of the first type being opposite charge type to channel current carriers.

36. The semiconductor device of Embodiment 35, wherein upon activation, the BJT injects the majority carriers to cause an acceleration of a failure of a gate dielectric of the DMOS transistor.

37. The semiconductor device of any of Embodiments 32-36, wherein the source serves as the emitter of the BJT, and wherein the drain is electrically connected to the collector.

38. The semiconductor device of any of Embodiments 32-37, wherein the DMOS transistor is an n-channel DMOS transistor such that the carriers injected of the first type to the backgate region are holes.

39. The semiconductor device of any of Embodiments 32-38, wherein the DMOS transistor comprises an extended drain drift region covered by a field oxide between the drain and a channel of the DMOS.

40. A semiconductor device configured with gate dielectric monitoring capability comprising: a metal-oxide-semiconductor (MOS) transistor including a source, a drain, and a backgate region formed in a semiconductor substrate, wherein the source and the backgate region are independently accessible.

41. The semiconductor device of Embodiment 40, wherein the MOS transistor comprises an extended drain drift region formed in the substrate.

42. The semiconductor device of Embodiment 41, wherein the extended drain drift region is covered by a field oxide between the drain and a channel of the MOS transistor.

43. The semiconductor device of any of Embodiments 40-42, wherein the MOS transistor is a double diffused metal-oxide-semiconductor (DMOS) transistor.

44. The semiconductor device of any of Embodiments 40-43, wherein the drain is a heavily doped region of the semiconductor substrate.

45. The semiconductor device of any of Embodiments 40-44, wherein the source is a heavily doped region of the semiconductor substrate.

46. The semiconductor device of any of Embodiments 41 or 42, wherein the extended drain drift region is a lightly doped region of the semiconductor substrate.

47. The semiconductor device of Embodiment 32-46, wherein the channel is doped with a dopant of opposite charge than that of the source and/or drain.

48. The semiconductor device of Embodiment 41, wherein the extended drain drift region is doped with a dopant of opposite charge than that of the channel.

49. The semiconductor device of any of Embodiments 32-48, further comprising a first contact connected to the source and a second contact connected to the backgate region, wherein the first contact and the second contact and independently accessible such that the first contact can provide a different voltage to the source than the second contact can provide to the backgate region.

In the embodiments described above, apparatus, systems, and methods for monitoring and accelerating the degradation of gate dielectrics in transistors are described in connection with particular embodiments. It will be understood, however, that the principles and advantages of the embodiments can be used for any other systems, apparatus, or methods.

The principles and advantages described herein can be implemented in various apparatuses. Examples of such apparatuses can include, but are not limited to, consumer electronic products, parts of the consumer electronic products, electronic test equipment, etc. Examples of parts of consumer electronic products can include clocking circuits, analog to digital converts, amplifiers, rectifiers, programmable filters, attenuators, variable frequency circuits, etc. Examples of the electronic devices can also include memory chips, memory modules, circuits of optical networks or other communication networks, and disk driver circuits. Consumer electronic products can include, but are not limited to, wireless devices, a mobile phone (for example, a smart phone), cellular base stations, a telephone, a television, a computer monitor, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a wrist watch, a smart watch, a clock, a wearable health monitoring device, etc. Further, apparatuses can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the embodiments provided herein can be applied to other systems, not necessarily the systems described above. The elements and acts of the various embodiments described above can be combined to provide further embodiments. The acts of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A method of monitoring a semiconductor device, the method comprising:

providing a semiconductor device comprising a metal-oxide-semiconductor (MOS) transistor comprising a source, a drain, a gate, and a backgate region, the semiconductor device further comprising a bipolar junction transistor (BJT) integrated on a same substrate with the MOS transistor, wherein a first well of a first dopant type forms the backgate region of the MOS transistor and serves as a base of the BJT and is independently accessible for activating the BJT, wherein the MOS transistor comprises an extended drain drift region comprising a second well of a second dopant type, opposite the first dopant type, between and abutting the drain and the first well; and operating the semiconductor device in an accelerated stress mode in which a source voltage ($V_s$) applied to the source and a backgate voltage ($V_{bg}$) applied to the backgate region are different voltages.

2. The method of claim 1, further comprising interchangeably operating the semiconductor device between the accelerated stress mode and a product mode, wherein in the product mode, the source and the backgate region are biased with a same voltage.

3. The method of claim 1, wherein the MOS transistor is a double diffused metal-oxide-semiconductor (DMOS) transistor comprising the extended drain drift region covered by a field oxide between the drain and a channel of the DMOS transistor.

4. The method of claim 2, wherein operating the semiconductor device in the accelerated stress mode further comprises:

activating the DMOS transistor by applying a gate voltage ($V_g$) to the gate that is greater in magnitude than the $V_s$ and the $V_{bg}$, and further applying a drain voltage ($V_d$) to the drain; and activating the BJT by applying the $V_{bg}$ that is greater in magnitude than the $V_s$.

5. The method of claim 4, wherein one or more of a difference between the $V_g$ and the $V_{bg}$ ($V_g-V_{bg}$), a difference between the $V_g$ and the $V_d$ ($V_g-V_d$) and a difference between the $V_d$ and the $V_{bg}$ ($V_d-V_{bg}$) are kept substantially constant between the accelerated stress mode and the product mode.

6. A method of monitoring a semiconductor device, the method comprising:

activating a metal-oxide-semiconductor (MOS) transistor by inducing a conductive channel between a source and a drain of the MOS transistor under a gate bias; and activating or deactivating a bipolar junction transistor (BJT) by applying a suitable bias to a backgate region of the MOS transistor, wherein a first well of a first dopant type forms the back gate region of the MOS transistor and serves as a base of the BJT and is independently accessible for activating the BJT, wherein the MOS transistor comprises an extended drain drift region comprising a second well of a second dopant type, opposite the first dopant type, between and abutting the drain and the first well, thereby injecting carriers of a first type to the backgate region, the carriers of the first type being opposite charge type to channel current carriers.

7. The method of claim 6, wherein the MOS transistor is a double diffused metal-oxide-semiconductor (DMOS) transistor.

8. The method of claim 7, wherein activating the DMOS transistor and activating the BJT comprises:

applying a drain voltage ($V_d$) to the drain of the DMOS transistor, wherein the drain is electrically connected to a collector of the BJT;

applying a backgate voltage ($V_{bg}$) to the backgate region of the DMOS transistor, wherein the backgate region of the DMOS serves as the base of the BJT; and applying a source voltage ($V_s$) to a source of the DMOS transistor, wherein the source of the DMOS transistor serves as an emitter of the BJT, wherein the $V_{bg}$ and the $V_s$ are different.

9. The method of claim 8, wherein deactivating the BJT comprises applying the same magnitude of the $V_{bg}$ and the $V_s$.

10. The method of claim 9, wherein one or more of a difference between the $V_g$ and the $V_{bg}$ ($V_g-V_{bg}$), a difference between the $V_g$ and the $V_d$ ($V_g-V_d$) and a difference between the $V_d$ and the $V_{bg}$ ($V_d-V_{bg}$) are kept substantially constant between activating and deactivating the BJT.

11. The method of claim 8, further comprising applying a gate voltage ($V_g$) to a gate of the DMOS transistor.

12. The method of claim 8, wherein applying the $V_{bg}$ to the backgate region activates the BJT and injects the carriers of the first type to the backgate region.

13. The method of claim 8, wherein the DMOS transistor is an n-channel DMOS transistor such that the carriers of the first type injected to the backgate region are holes.

14. The method of claim 8, further comprising increasing the $V_{bg}$ to the backgate region to increase the carriers of the first type.

15. The method of claim 8, further comprising applying a ground voltage to both the source and the backgate region of the DMOS transistor.

16. A method of operating a semiconductor device which includes a double diffused metal-oxide-semiconductor (DMOS) transistor, the method comprising:

providing a first well of a first dopant type forming a backgate region of the DMOS transistor, and an extended drain drift region of the DMOS transistor comprising a second well of a second dopant type, opposite the first dopant type, between and abutting a drain of the DMOS transistor and the first well;

activating the DMOS transistor by inducing a conductive channel between a source and the drain of the DMOS transistor under a gate bias; and flowing a current of a first type of carrier through the conductive channel by applying a bias between the source and the drain, wherein by flowing the current of a first type of carrier, a current of a second type of carrier opposite the first charge type of the first type of carrier flows in the opposite direction, and wherein the current of the second type of carrier causes a failure of a gate dielectric of the DMOS transistor.

17. The method of claim 16, wherein activating the DMOS transistor comprises:

applying a drain voltage ($V_d$) to the drain of the DMOS transistor;

applying a backgate voltage ($V_{bg}$) to the backgate region of the DMOS transistor;

applying a source voltage ($V_s$) to the source of the DMOS transistor, wherein the $V_s$ and the $V_{bg}$ are the same voltage; and applying a gate voltage ($V_g$) to a gate of the DMOS transistor.

18. The method of claim 17, further comprising activating a bipolar junction transistor (BJT) by applying the $V_{bg}$ that is higher in magnitude than the $V_s$, wherein the backgate region of the DMOS transistor serves as a base of the BJT and is independently accessible for activating the BJT, thereby injecting carriers of the second type to the backgate region.

19. The method of claim 18, wherein applying the voltage of the $V_{bg}$ and the $V_s$ deactivates the BJT.

20. The method of claim 19, wherein one or more of a difference between the $V_g$ and the $V_{bg}$ ($V_g-V_{bg}$), a difference between the $V_g$ and the $V_d$ ($V_g-V_d$) and a difference between the $V_d$ and $V_{bg}$ ($V_d-V_{bg}$) are kept substantially constant between activating and deactivating the BJT.

* * * * *